US012765375B2

(12) United States Patent
Chen

(10) Patent No.: US 12,765,375 B2
(45) Date of Patent: Oct. 13, 2026

(54) SEMICONDUCTOR PACKAGE AND METHOD

(71) Applicant: Taiwan Semiconductor Manufacturing Co., Ltd., Hsinchu (TW)

(72) Inventor: Ming-Fa Chen, Taichung City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 841 days.

(21) Appl. No.: 17/859,297

(22) Filed: Jul. 7, 2022

(65) Prior Publication Data

US 2024/0014095 A1 Jan. 11, 2024

(51) Int. Cl.
*H10W 74/00* (2026.01)
*H10W 40/00* (2026.01)
(Continued)

(52) U.S. Cl.
CPC ....... *H10W 40/228* (2026.01); *H10W 40/037* (2026.01); *H10W 90/00* (2026.01);
(Continued)

(58) Field of Classification Search
CPC . H01L 23/3677; H01L 21/4882; H01L 24/08; H01L 24/16; H01L 24/32; H01L 24/73; H01L 24/80; H01L 25/0657; H01L 2224/08145; H01L 2224/08245; H01L 2224/16227; H01L 2224/16237; H01L 2224/32225; H01L 2224/73204;
(Continued)

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |

(Continued)

FOREIGN PATENT DOCUMENTS

| | | | |
|---|---|---|---|
| TW | 201413883 | A | 4/2014 |
| TW | 202103276 | A | 1/2021 |
| TW | 202109794 | A | 3/2021 |

*Primary Examiner* — Matthew C Landau
*Assistant Examiner* — Vincent Kipkemoi Rono
(74) *Attorney, Agent, or Firm* — Slater Matsil, LLP

(57) ABSTRACT

A semiconductor package including a thermally conductive bridge and a method of forming are provided. The semiconductor package may include a first semiconductor device having a first substrate and first contact pads on the first substrate, a first thermally conductive feature on the first substrate and extending into the first substrate, a second semiconductor device over the first substrate, wherein the second semiconductor device may include second contact pads electrically connected to the first contact pads, a first thermally conductive bridge over the first semiconductor device and beside the second semiconductor device, and a first encapsulant over the first semiconductor device and along sidewalls of the second semiconductor device and the first thermally conductive bridge. The first thermally conductive bridge may include a second substrate and a second thermally conductive feature on the second substrate and extending into the second substrate, wherein the second thermally conductive feature may be bonded to the first thermally conductive feature.

20 Claims, 27 Drawing Sheets

(51) Int. Cl.

| | |
|---|---|
| ***H10W 40/22*** | (2026.01) |
| ***H10W 90/00*** | (2026.01) |
| *H10W 72/00* | (2026.01) |
| *H10W 74/15* | (2026.01) |
| *H10W 76/63* | (2026.01) |
| *H10W 80/00* | (2026.01) |
| *H10W 90/20* | (2026.01) |

(52) U.S. Cl.
CPC ...... *H10W 72/07236* (2026.01); *H10W 74/00* (2026.01); *H10W 74/15* (2026.01); *H10W 76/63* (2026.01); *H10W 80/312* (2026.01); *H10W 80/327* (2026.01); *H10W 90/20* (2026.01); *H10W 90/288* (2026.01); *H10W 90/297* (2026.01); *H10W 90/724* (2026.01); *H10W 90/734* (2026.01); *H10W 90/792* (2026.01); *H10W 90/796* (2026.01)

(58) Field of Classification Search
CPC ... H01L 2224/8083; H01L 2224/80895; H01L 2224/80896; H01L 2225/06517; H01L 2225/06524; H01L 2225/06541; H01L 2225/06589; H01L 2924/16251; H01L 2924/1632; H01L 2924/182; H01L 2224/0401; H01L 2224/05571; H01L 2224/08146; H01L 2224/08147; H01L 23/481; H01L 24/05; H01L 25/50; H01L 2224/0557; H01L 2224/06181; H01L 2225/06568; H01L 2225/06586; H01L 23/4334; H01L 24/92; H01L 23/36
See application file for complete search history.

(56) References Cited

U.S. PATENT DOCUMENTS

| | | | | |
|---|---|---|---|---|
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 2016/0086871 | A1 | 3/2016 | Kourakata et al. | |
| 2017/0358535 | A1* | 12/2017 | Yoo ..................... | H10W 70/614 |
| 2020/0185300 | A1 | 6/2020 | Xu et al. | |
| 2021/0005527 | A1 | 1/2021 | Choi et al. | |
| 2021/0066279 | A1* | 3/2021 | Yu ...................... | H10W 40/778 |
| 2021/0257277 | A1 | 8/2021 | Bertrand et al. | |
| 2022/0102305 | A1* | 3/2022 | Krishnatreya ...... | H10W 70/685 |

* cited by examiner

400

SEMICONDUCTOR PACKAGE AND METHOD

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a trend for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
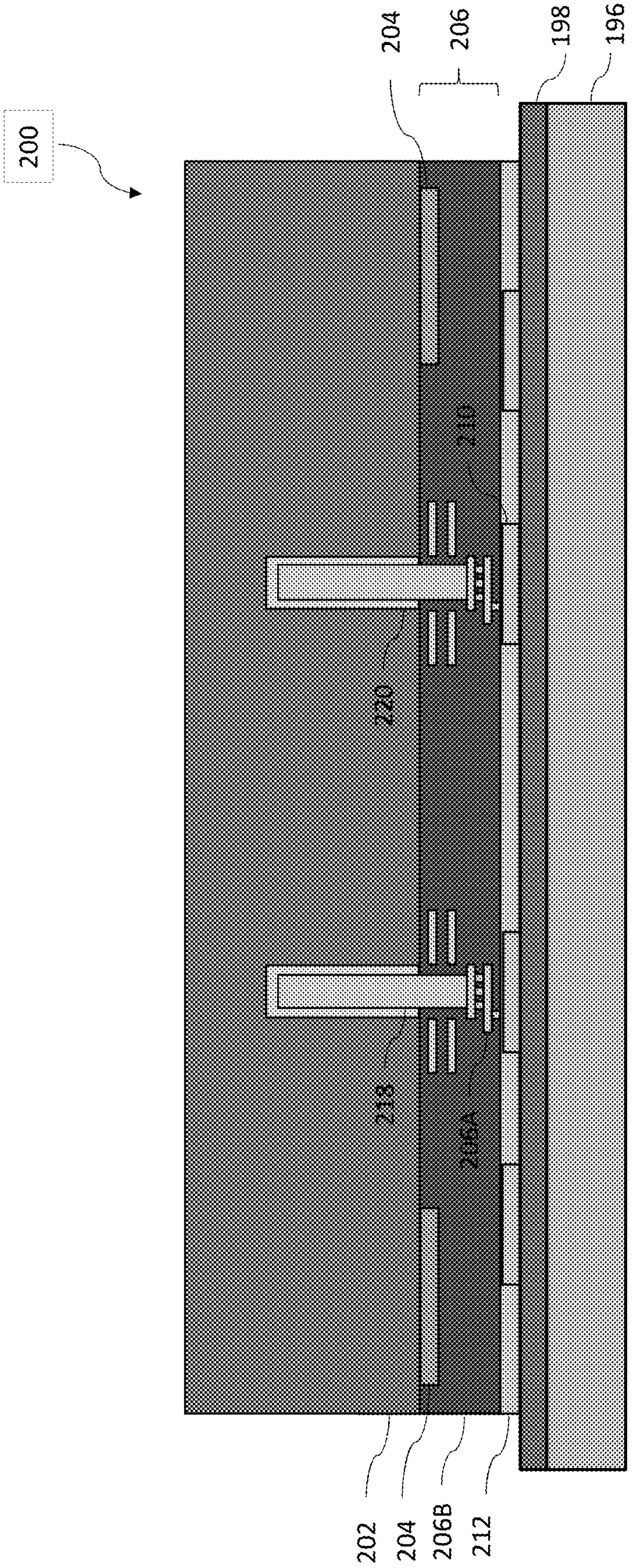
FIGS. 1, 2, 3, 4, 5A, 5B, 5C, 5D, 5E, 5F, 6A, 6B, 7A, 7B, 7C, 8, 9, 10A, 10B, 11, 12, 13, 14, 15, 16, 17, and 18 illustrate cross-sectional and top views of manufacturing a semiconductor package according to some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor package with a heat dissipation system and the method of forming the same are provided. In accordance with some embodiments, a first semiconductor device and a second semiconductor device are bonded together. The heat dissipation system comprises various heat transfer features and heat transfer bridges. The heat transfer features comprise thermally conductive material, and are disposed on and may extend into substrates of the first semiconductor device and the second semiconductor device. Heat transfer bridges, which may include heat transfer features, are placed over the first semiconductor device and the second semiconductor device, wherein the heat transfer features of the first semiconductor device and the second semiconductor device may be bonded to the heat transfer features of the heat transfer bridges to provide pathways to transfer the heat generated by the first and second semiconductor devices to a heat sink disposed at the top of the semiconductor package, thereby leading to higher efficiency and better long-term reliability of the semiconductor package.

FIGS. 1 through 15 are cross-sectional and top views of intermediate steps of a manufacturing process of a semiconductor package 600 (see FIGS. 15) including a heat dissipation system in accordance with some embodiments.

Referring to FIG. 1, a semiconductor device 200 is attached to a carrier 196 by a release film 198. The semiconductor device 200 may be a bare semiconductor die (e.g., unpackaged semiconductor die) that is formed as part of a larger wafer. For example, the semiconductor device 200 may be a logic die (e.g., application processor (AP), central processing unit (CPU), microcontroller, etc.), a memory die (e.g., dynamic random access memory (DRAM) die, hybrid memory cube (HBC), a static random access memory (SRAM) die, a wide input/output (wideIO) memory die, a magnetoresistive random access memory (mRAM) die, a resistive random access memory (rRAM) die, etc.), a power management die (e.g., power management integrated circuit (PMIC) dies), a radio frequency (RF) die, a sensor die, a micro-electro-mechanical-system (MEMS) die, a signal processing die (e.g., digital signal processing (DSP) die), a front-end die (e.g., analog front-end (AFE) die), a biomedical die, or the like. The semiconductor device 200 may be a package comprising a bare semiconductor die.

The semiconductor device 200 may be processed according to applicable manufacturing processes to form integrated circuits in the semiconductor device 200. The semiconductor device 200 may be formed as part of a larger wafer with other semiconductor devices 200 and subsequently singulated from the wafer. The semiconductor device 200 may include a substrate 202, such as silicon, doped or undoped, or an active layer of a semiconductor-on-insulator (SOI) substrate. The substrate 202 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP, or combinations thereof. Other substrates, such as multi-layered or gradient substrates, may also be used.

Active and/or passive devices or electrical components, such as transistors, diodes, capacitors, resistors, etc., may be formed in and/or on the substrate 202. The devices are collectively illustrated by devices 204 for illustrative purposes. The devices 204 may be interconnected by an interconnect structure 206 comprising metallization patterns 206A in one or more dielectric layers 206B on the substrate 202. The interconnect structures 206 electrically connect the devices 204 on the substrate 202 to form one or more integrated circuits. In some embodiments, the devices 204 may generate relatively high levels of heat during operation, thereby creating thermal hotspots.

The semiconductor device 200 further includes through vias 218, which may be electrically connected to the metallization patterns 206A in the interconnect structure 206. The through vias 218 may comprise a conductive material (e.g., copper, or the like) and may extend from the interconnect structure 206 into the substrate 202. One or more insulating barrier layers 220 may be formed around at least portions of the through vias 218 in the substrates 202. The insulating barrier layers 220 may comprise, for example, silicon oxide, silicon nitride, silicon oxynitride, or the like, and may be used to physically and electrically isolate the through vias 218 from the substrate 202. Two through vias 218 are illustrated in the semiconductor device 200 in FIG. 1 as an example, other numbers of the through vias 218 may be in the semiconductor device 200. In subsequent processing steps, the substrate 202 may be thinned to expose the through vias 218 (shown in FIG. 3). After thinning, the through vias 218 provide electrical connection from a back side of the substrate 202 to a front side of the substrate 202. In some embodiments, the back side of the substrate 202 may refer to a side of the substrate 202 opposite to devices 204 and the interconnect structure 206 while the front side of the substrate 202 may refer to a side of the substrate 202 on which devices 204 and the interconnect structure 206 are disposed.

The semiconductor device 200 further comprises contact pads 210 on the interconnect structure 206, which allow external electrical connections to be made to the interconnect structure 206 and devices 204 on the substrate 202. The contact pads 210 may comprise copper, aluminum, or another conductive material. A dielectric layer 212 is disposed on the interconnect structure 206, and the contact pads 210 are exposed at a top surface of the dielectric layer 212. The dielectric layer 212 may comprise silicon oxide, silicon oxynitride, silicon nitride, or the like.

Still referring to FIG. 1, the carrier 196 may be a glass carrier, an organic carrier, or the like. The carrier 196 may have a round top-view shape, and may have a size of a silicon wafer. FIG. 1 shows one semiconductor device 200 attached to the carrier 196 for illustrative purposes. Numerous semiconductor devices 200 may be attached to the carrier 196 to be processed at the same time. The release film 198 may be formed of a polymer-based material, such as a light-to-heat-conversion (LTHC) material, which may be removed along with the carrier 196 from the semiconductor device 200 in subsequent steps. The release film 22 may be coated onto the carrier 196.

Figure 2:
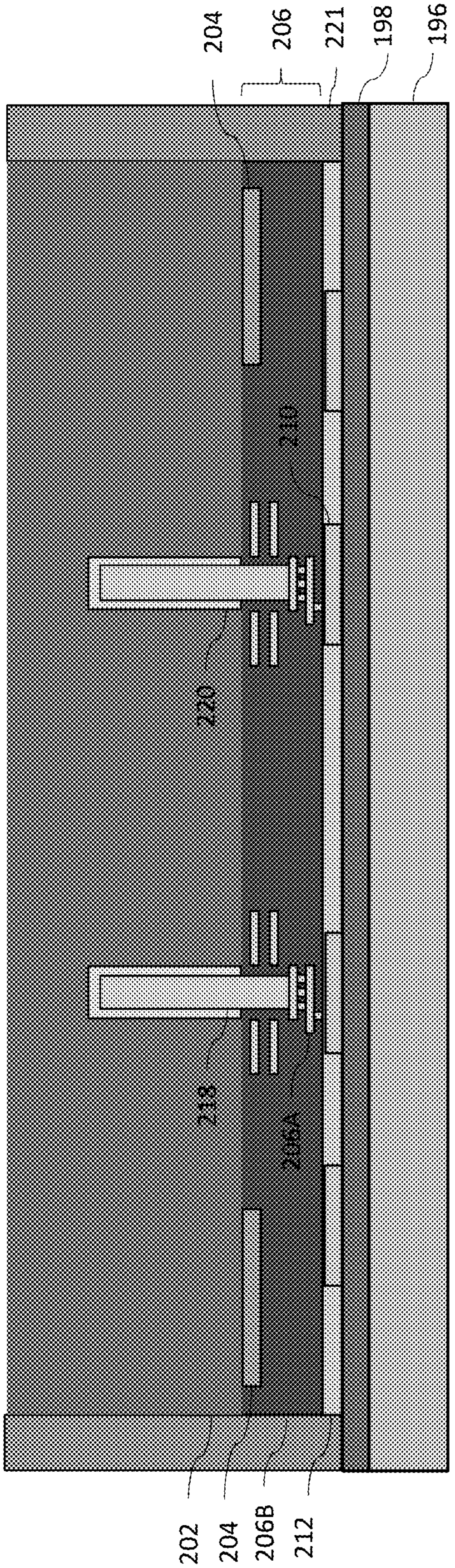

In FIG. 2, an encapsulant 221 is deposited over the carrier 196. The encapsulant 221 may extend along sidewalls of the semiconductor device 200. The encapsulant 221 may encircle the semiconductor device 200 in a top view. In some embodiments, the encapsulant 221 may comprise silicon oxide, silicon nitride, silicon carbide, silicon carbonitride, silicon oxynitride, silicon oxycarbonitride, un-doped silicate glass (USG), or the like, and may be formed using a suitable deposition process such as chemical vapor deposition (CVD), physical vapor deposition (PVD), atomic layer deposition (ALD), or the like. In some embodiments, the encapsulant 221 may comprise a molding compound, an epoxy, a resin, or the like and may be formed by applying compression molding, transfer molding, or the like before being cured. In some embodiments, the encapsulant 221 may be formed over the back side of the substrate 202 and a planarization process, such as a chemical mechanical polishing (CMP) may be performed to expose the back side of the substrate 202.

Figure 3:
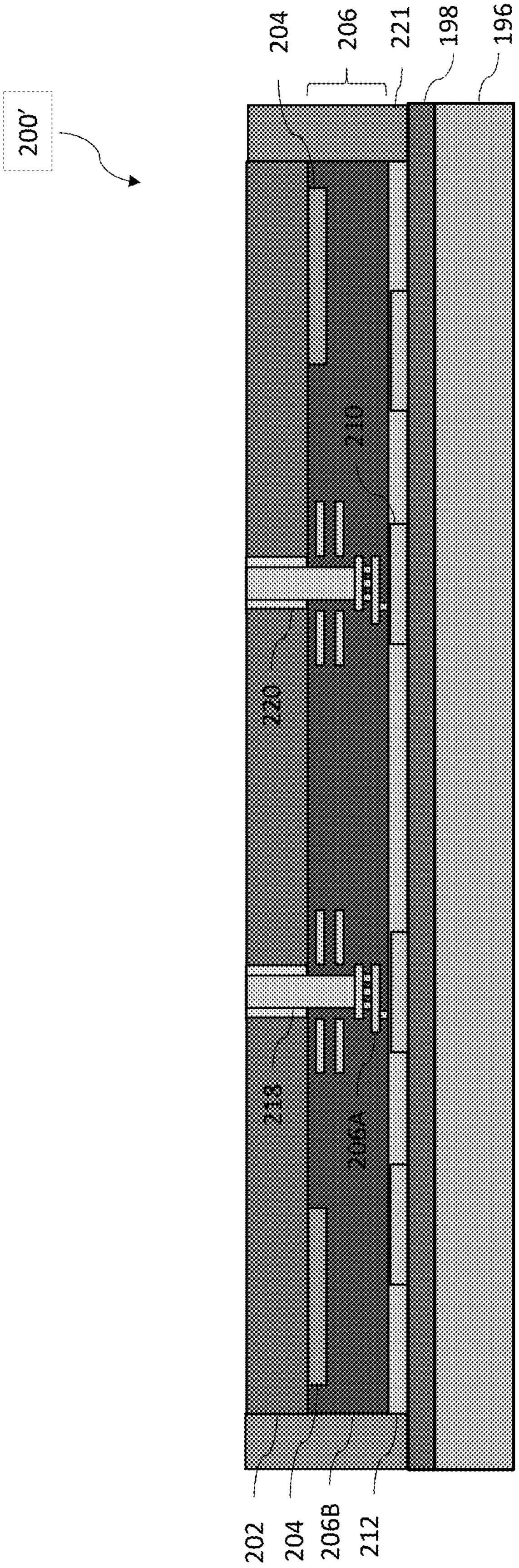

In FIG. 3, a thinning process may be applied to the semiconductor device 200 to expose the through vias 218. The thinned semiconductor device 200 may be referred to as semiconductor device 200'. The thinning removes portions of the substrate 202 over the through vias 218 and portions of the encapsulant 221. In some embodiments, the thinning may further remove top portions of the insulating barrier layers 220 on the through vias 218 to expose the through vias 218. The thinning process may comprise performing a CMP, grinding, an etch back (e.g., a wet etch), combinations thereof, or the like. In some embodiments, the thinning process results in a back side of the substrate 202 being level with top surfaces of the through vias 218 and top surfaces of the encapsulant 221. In some embodiments, the thinning process may recess the substrate 202 such that the through vias 218 protrude from a back surface of the substrate 202, which can be achieved by a selective etching process that selectively etches the substrate 202, the insulating barrier layers 220, and the encapsulant 221 without significantly etching the through vias 218.

Figure 4:
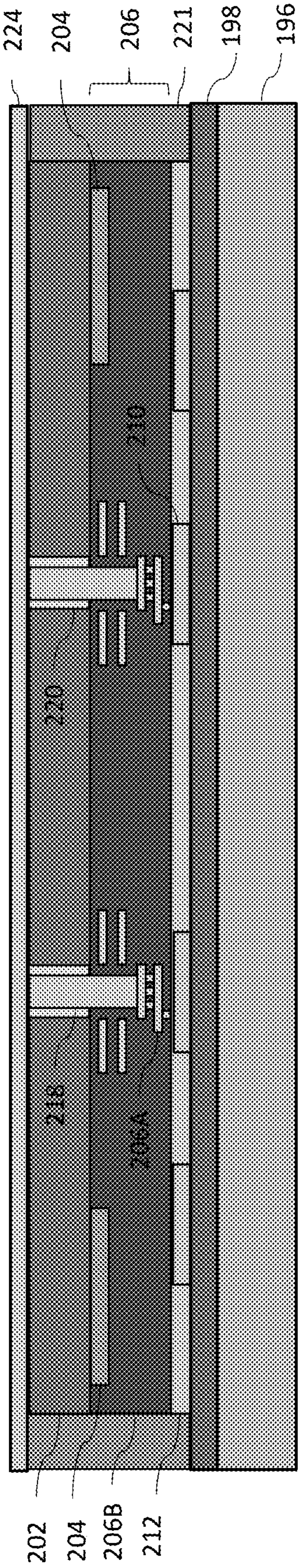

In FIG. 4, a dielectric layer 224 is deposited over the substrate 202, the encapsulant 221, the insulating barrier layers 220 and the through vias 218. The dielectric layer 224 may comprise silicon oxide, silicon nitride, silicon carbide, silicon carbonitride, silicon oxynitride, silicon oxycarbonitride, USG, or the like, and may be formed using a suitable deposition process such as CVD, PVD, ALD, or the like. The dielectric layer 224 may act as a bonding layer in subsequent processes. The material of the dielectric layer 224 may be selected so that it is suitable for direct fusion bonding.

Figure 15:
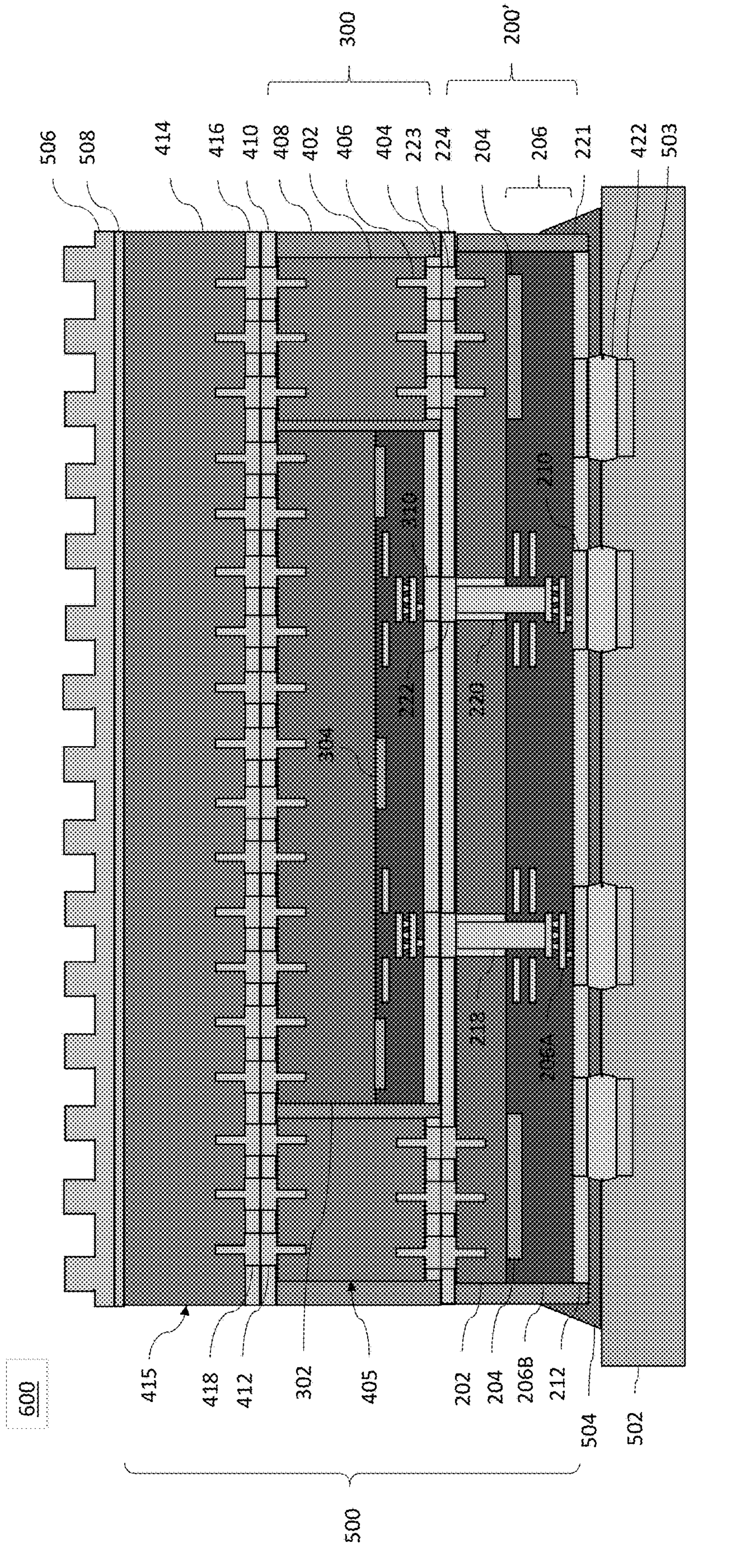

FIGS. 5A, 5B, 5C, 5D, 5E, and 5F illustrate the formation of bond pads 222 and heat transfer features 223 in the dielectric layer 224 and the substrate 202, by techniques such as a damascene process, dual damascene process, or the like. The bond pads 222 may be disposed directly on the through vias 218 and may provide bonding sites that electrically and physically connect the through vias 218 to external devices, such as other integrated circuits. As discussed in greater detail below, heat transfer features 223 (see FIG. 5D) are a part of the heat dissipation system used to transfer heat away from the semiconductor device 200'. The heat transfer features 223 may be disposed over the devices 204 and may provide pathways for heat generated by devices 204 during operation to be transferred out of the semiconductor device 200', thereby leading to higher efficiency and better long-term reliability of semiconductor package 600 as shown in FIG. 15.

Figure 5A:
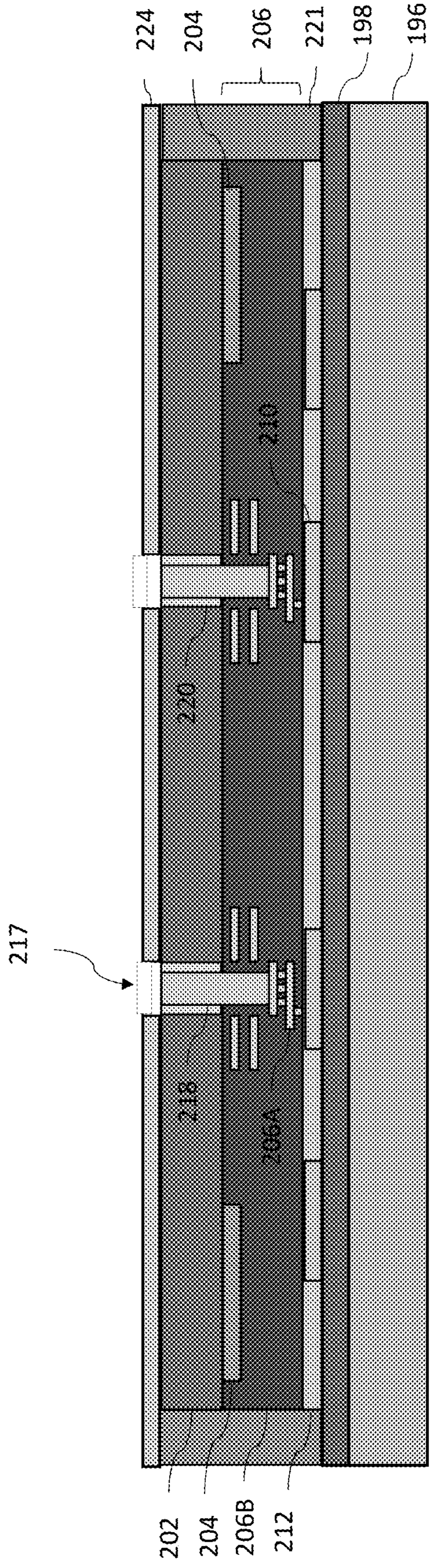

In FIG. 5A, openings 217 are formed in the dielectric layer 224 and may expose the underlying through vias 218 and insulating barrier layers 220. Forming the openings 217 may include forming a patterned mask (not shown), such as a photoresist or one or more layers of dielectric material over the dielectric layer 224, and performing an etching process, such as wet or dry etching, to remove the exposed portions of the dielectric layer 224. The patterned mask may be removed after the etching process.

Figure 5B:
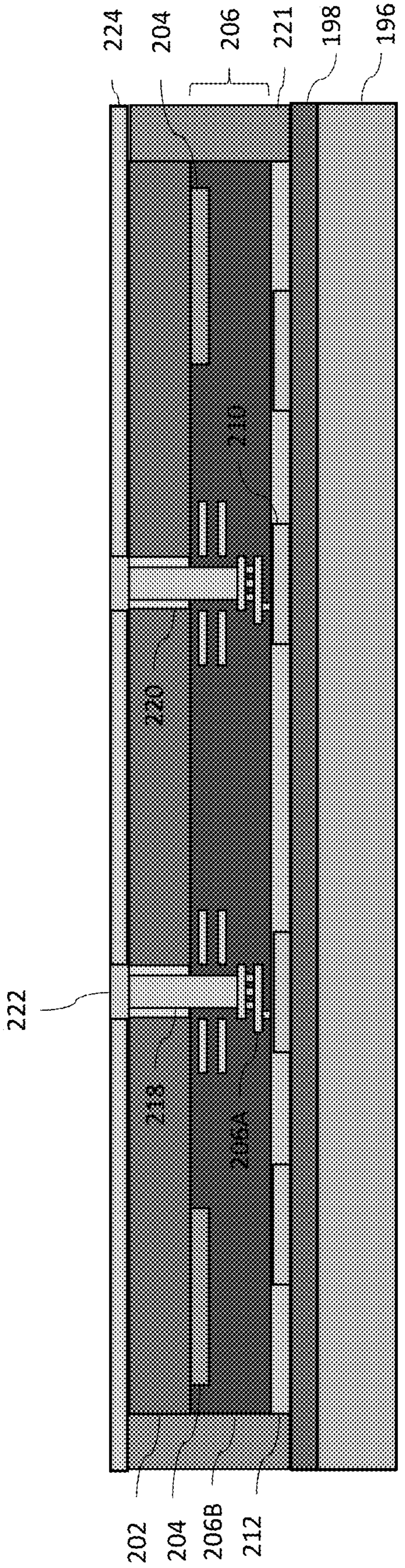

In FIG. 5B, bond pads 222 are formed in the openings 217. The bond pads 222 may comprise a conductive material, such as copper or the like, formed by an electrochemical plating process, an electroless plating process, CVD, ALD, PVD, the like, or a combination thereof. A planarization process, such as CMP, may be performed to remove the excess conductive material. The bond pads 222 may be electrically connected to the devices 204 of the semiconductor device 200' by the through vias 218. In the embodiments where the through vias 218 protrude from the back side of the substrate 202, the bond pads 222 may be omitted, and the dielectric layer 224 may be formed to surround protruding portions of the through vias 218.

Figure 5C:
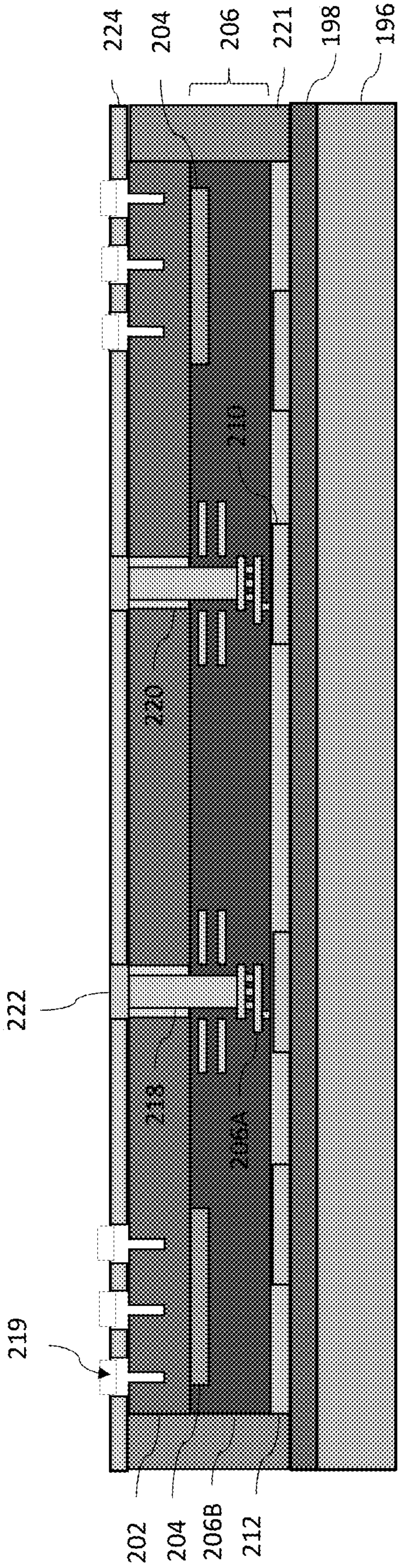

In FIG. 5C, openings 219 are formed in the dielectric layer 224 and the substrate 202. Each opening 219 may comprise a top portion extending through the dielectric layer 224 and a bottom portion extending into the substrate 202. The top portion may be wider than the bottom portion. Forming the top portions of openings 219 may include forming a first patterned mask (not shown), such as a photoresist or one or more layers of dielectric material, having openings corresponding to the desired openings in the dielectric layer 224, and performing an etching process, such as wet or dry etching, to remove the exposed portions of the dielectric layer 224. The first patterned mask may be removed after the etching process. Forming the bottom portions of openings 219 may include forming a second patterned mask (not shown), such as a photoresist or one or more layers of dielectric material, having openings corresponding to the desired openings or trenches in the substrate 202, and performing an etching process, such as wet or dry etching, to remove the portions of the substrate 202 that remain exposed. The second patterned mask may be removed after the etching process.

Figure 5D:
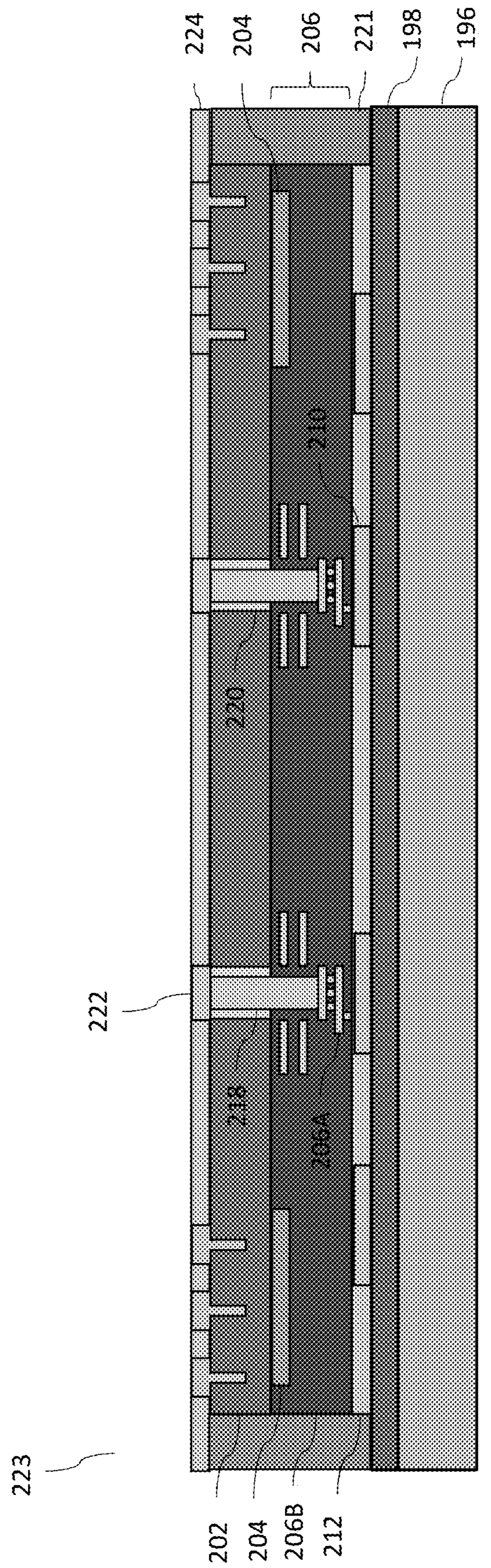

In FIG. 5D, heat transfer features 223 are formed in the openings 219. The heat transfer features 223 may comprise a thermally conductive material, such as copper, gold, silver, aluminum, or the like. In some embodiments, the heat transfer features 223 may be formed by the same or similar method as discussed above with reference to the bond pads 222. A planarizing process, such as CMP, may be performed to remove the excess thermally conductive material and seed layer. The heat transfer features 223 may have substantially the same shape and size within process variations. The heat transfer features 223 may be electrically isolated from the integrated circuits of the semiconductor device 200'. Three heat transfer features 223 are shown on each side of the structure shown in FIG. 5D as an example, other numbers are possible. FIGS. 5A through 5D illustrate forming the bond pads 222 before forming the heat transfer features 223 as an example, the bond pads 222 may be formed after forming the heat transfer features 223 or the bond pads 222 and the heat transfer features 223 may be formed at the same time.

Figure 5E:
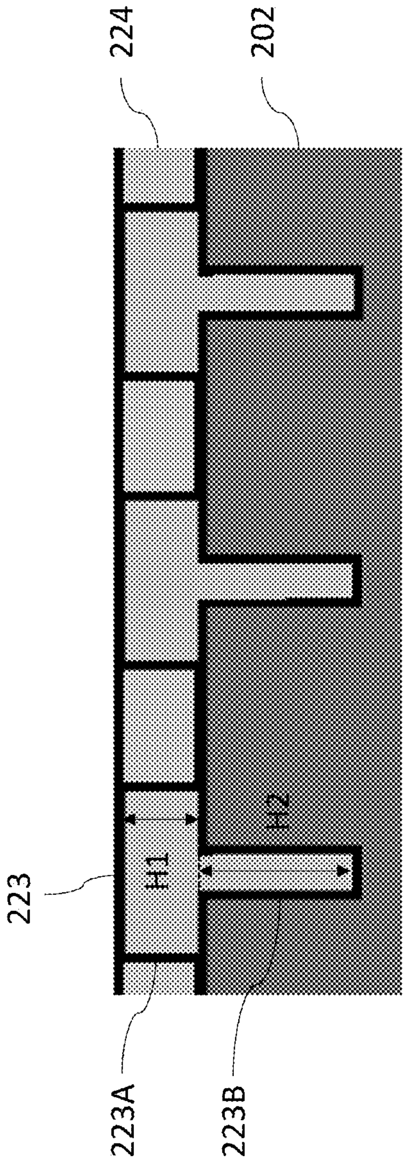

FIG. 5E shows a portion of the structure shown in FIG. 5D. Each heat transfer feature 223 may comprise a top portion 223A in the dielectric layer 224 and a bottom portion 223B in the substrate 202. The top portion 223A has a height H1, which may be in a range from about 0.2 μm to about 1 μm, and the bottom portion 223B has a height H2, which may be in a range from about 0.4 μm to about 10 μm. In some embodiments, the height H2 may be greater than the height H1.

Figure 5F:
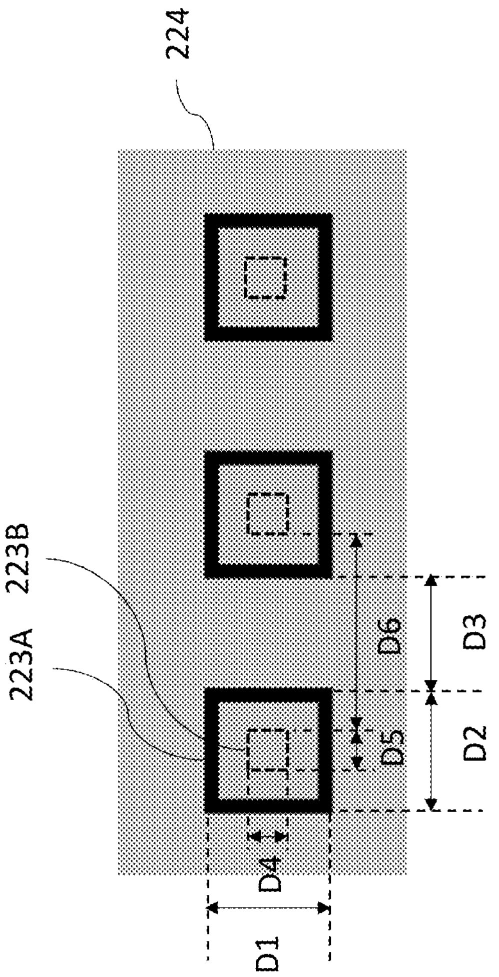

FIG. 5F shows a top view of the structure shown in FIG. 5E. In some embodiments, the top portion 223A may have a rectangular or square shape in the top view with a length D1 and a width D2, which may be in a range from about 0.05 μm to about 10 μm. The top portion 223A may be spaced apart from a neighboring top portion 223A by a distance D3, which may be greater than or equal to 0.02 μm. The bottom portion 223B may have a rectangular shape in the top view with a length D4 and a width D5, which may be in a range from about 0.02 μm to about 8 μm. The bottom portion 223B may be spaced apart from a neighboring bottom portion 223B by a distance D6, which may be greater than or equal to about 0.02 μm. In some embodiments, the length D1 and the width D2 may be greater than the length D4 and the width D5, respectively. In some embodiments, the top portion 223A and bottom portion 223B may have a circular shape in the top view (not shown). Other shapes and sizes are possible.

Figure 6A:
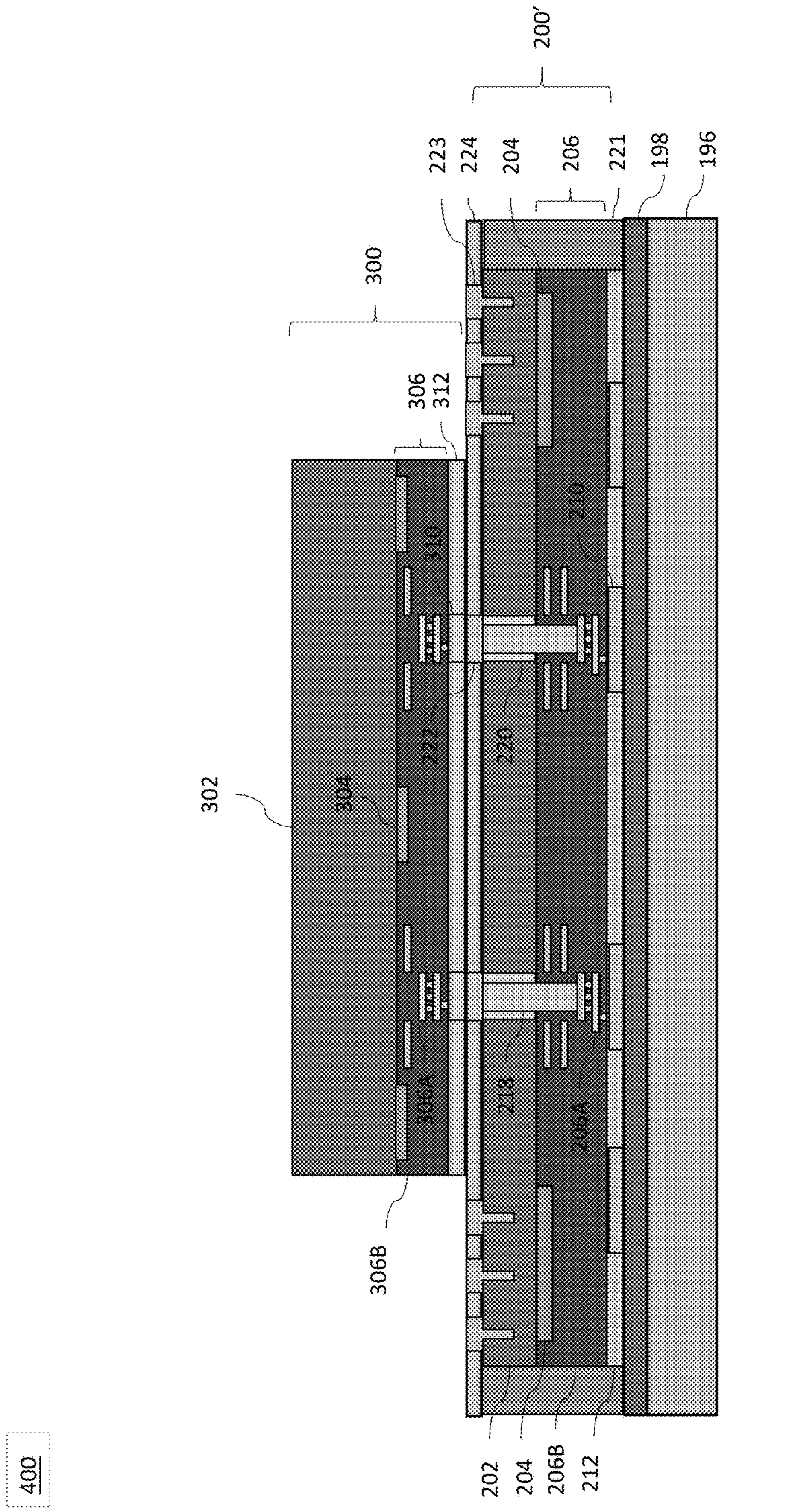

In FIG. 6A, a semiconductor device 300 is bonded to the dielectric layer 224 and the bond pads 222 on the semiconductor device 200'. The semiconductor device 300 may be a bare semiconductor die (e.g., unpackaged semiconductor die) that is formed as part of a larger wafer or a package comprising a bare semiconductor die, similar to the semiconductor device 200. The semiconductor device 300 may be processed according to applicable manufacturing processes to form integrated circuits in the semiconductor device 300. In some embodiments, the semiconductor device 300 may also be formed initially as part of a larger wafer with other semiconductor devices 300 and subsequently singulated from the wafer. The materials and manufacturing processes of the features in the semiconductor device 300 may be found by referring to the like features in the semiconductor device 200, with the like features in the semiconductor device 200 having reference numerals starting with number "2," which correspond to the features in the semiconductor device 300 having reference numerals starting with number "3." The semiconductor device 300 may include a substrate 302 having devices or electrical components (e.g., transistors, capacitors, diodes, resistors, or the like) formed thereon and an interconnect structure 306. The devices are collectively illustrated by devices 304 for illustrative purposes. The interconnect structure 306 includes metallization patterns 306A in one or more dielectric layers 306B, and the metallization patterns 306A electrically connect the devices 304 on the substrate 302 to form one or more integrated circuits. In some embodiments, the devices 304 may generate relatively high levels of heat during operation. The interconnect structure 306 further includes a dielectric layer 312 and bond pads 310 that are electrically connected to the metallization patterns 306A. Two bond pads 310 are illustrated in the semiconductor device 300 in FIG. 6A as an example, other numbers of the contact pads 310 may be in the semiconductor device 300.

The semiconductor device 300 may be bonded to the dielectric layer 224 and the bond pads 222 on the semiconductor device 200 using a bonding process, such as a hybrid bonding process, to form wafer structure 400, wherein the dielectric layer 312 of the semiconductor device 300 may be directly bonded to the dielectric layer 224 on the semiconductor device 200', and bond pads 310 of the semiconductor device 300 may be directly bonded to the bond pads 222 on the semiconductor device 200'. The semiconductor device 300 may be disposed face down such that a front side of the substrate 302 faces the back side of the substrate 302. In some embodiments, the front side of the substrate 302 may refer to a side of the substrate 302 on which devices 304 and the interconnect structure 306 are disposed. In some embodiments, the bond between the dielectric layer 312 and the dielectric layer 224 is an oxide-to-oxide bond, or the like and the bond between the bond pads 310 and the bond pads 222 is a metal-to-metal bond, thereby providing electrical connection between the semiconductor device 200' and the semiconductor device 300. In the embodiments where the bond pads 222 are omitted, the bond pads 310 are directly bonded to the through vias 218 by direct metal-to-metal bonding. FIG. 6A illustrated a hybrid bonding process as an example, other bonding process may be used, such as a solder bonding process or the like.

As an example, the hybrid bonding process may start with a surface treatment to the dielectric layer 224 and the dielectric layer 312. The surface treatment may include a plasma treatment in a vacuum environment. The surface treatment may further include a cleaning process, such as a rinse with deionized water, or the like. The hybrid bonding process may then proceed to aligning the bond pads 310 to the bond pads 222 (or the through vias 218). When the semiconductor device 200' and the semiconductor device 300 are aligned, the bond pads 310 may overlap with the corresponding bond pads 222. Next, the pre-bonding may be performed, during which the semiconductor device 200' is put in contact with the semiconductor device 300 at room temperature (e.g., between about 21° C. and about 25° C.). The hybrid bonding process may continue with performing an annealing, at a temperature between about 150° C. and about 400° C. for a duration between about 0.5 hours and about 3 hours, so that the metal in the bond pads 310 and the metal in the bond pads 222 inter-diffuse across the interfaces between the bond pads 310 and the bond pads 222, which forms the metal-to-metal bond. One semiconductor device 300 is illustrated as being bonded to the semiconductor device 200' in FIG. 6A as an example, multiple semiconductor devices 300 may be bonded to the semiconductor device 200'.

Figure 6B:
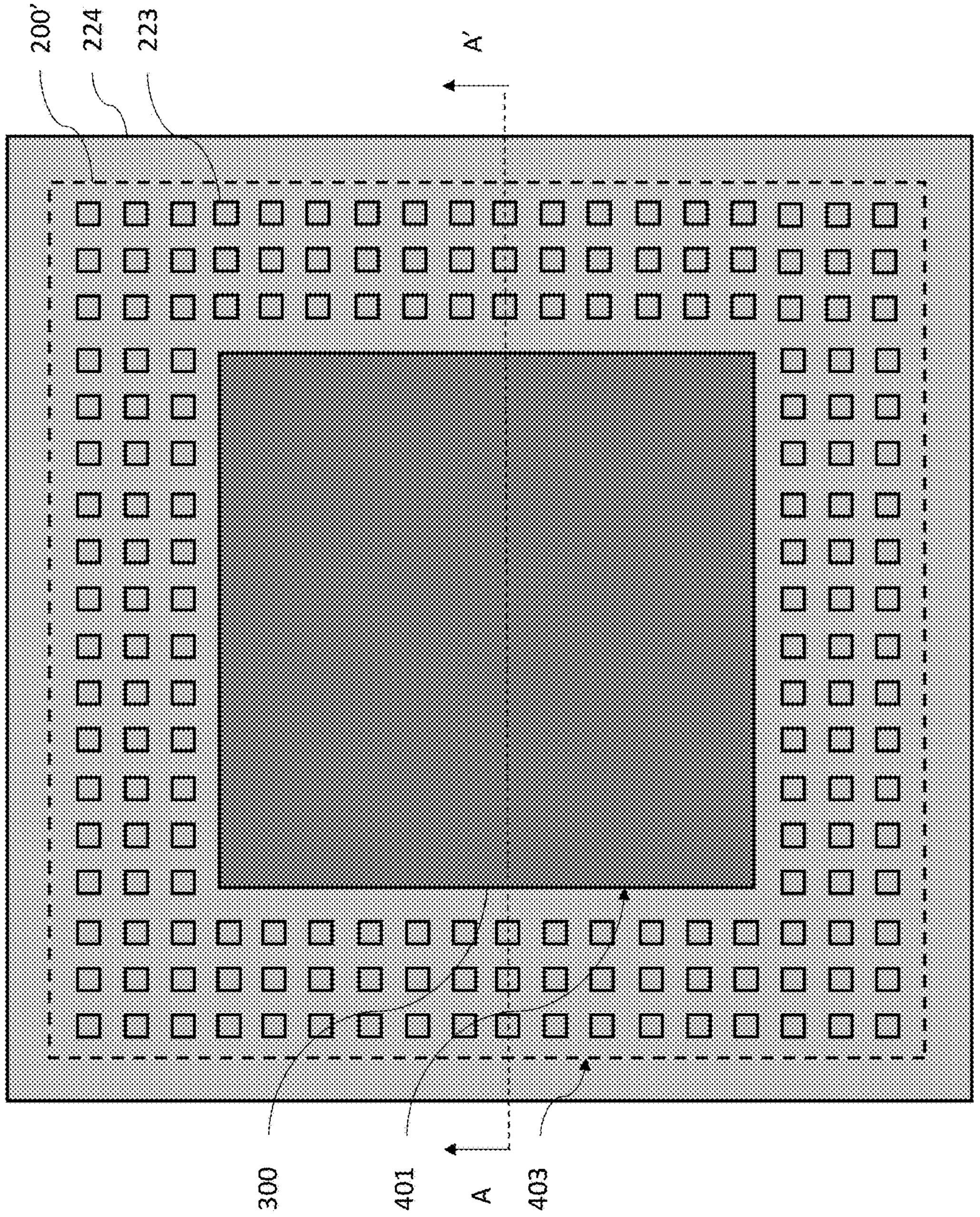

In FIG. 6B, a top view of the wafer structure 400 is shown. The cross-sectional view shown in FIG. 6A may be obtained from the reference cross-section A-A' in the top view shown in FIG. 6B, wherein like reference numerals refer to like features. The semiconductor device 200' that is covered by the dielectric layer 224 is shown in dashed lines for illustrative purposes. A top surface of the semiconductor device 200' may have an area A1 and a top surface of the semiconductor device 300 may have an area A2, wherein the area A1 is larger than the area A2 and the difference between the area A1 and the area A2 is an area A3. The portion of the top surface of the semiconductor device 200' that is disposed underneath the semiconductor device 300 is referred to as region 401, which may have the area A1, and the region of the top surface of the semiconductor device 200' that is not disposed underneath the semiconductor device 300 is referred to as region 403, which may have the area A3. As shown in FIG. 6B, the heat transfer features 223 are disposed in the region 403 in an array comprising columns and rows, which encircles the semiconductor device 300. The sum of areas of top surfaces of the heat transfer features 223 is A4, and a ratio of A4 to A3 may be in a range from about 30% to about 80%. The heat transfer features 223 may be arranged in other patterns, such as staggered rows or the like.

Figure 7A:
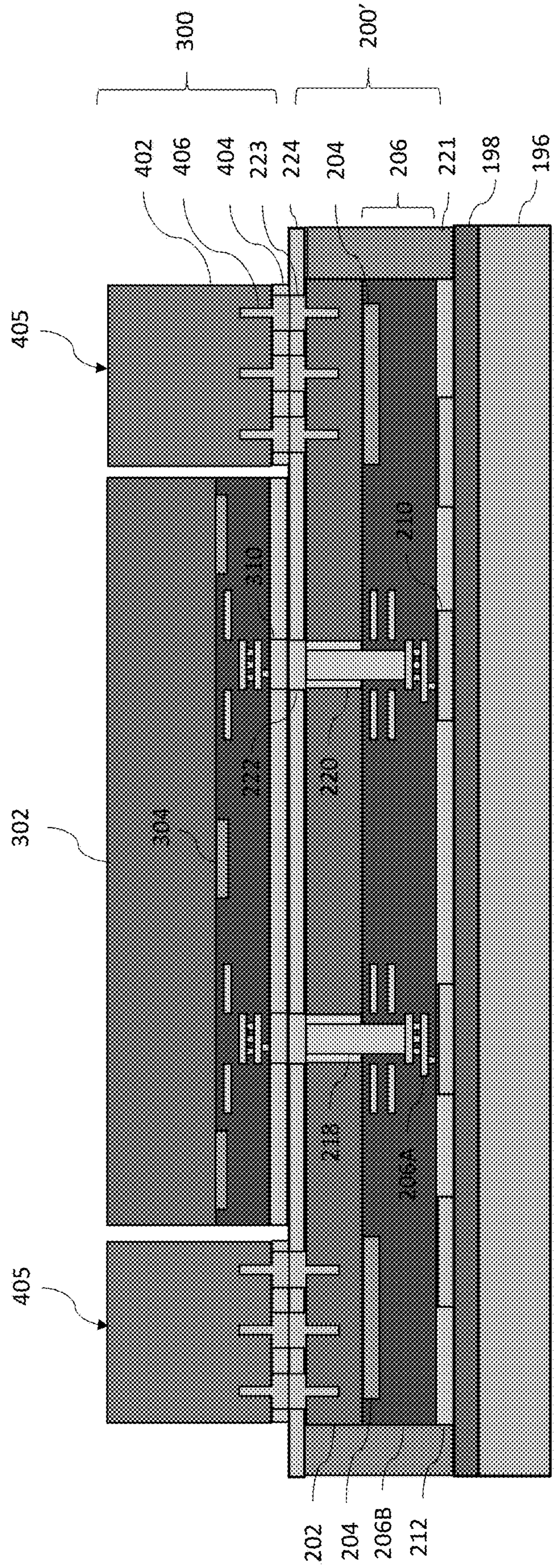
Figure 7B:
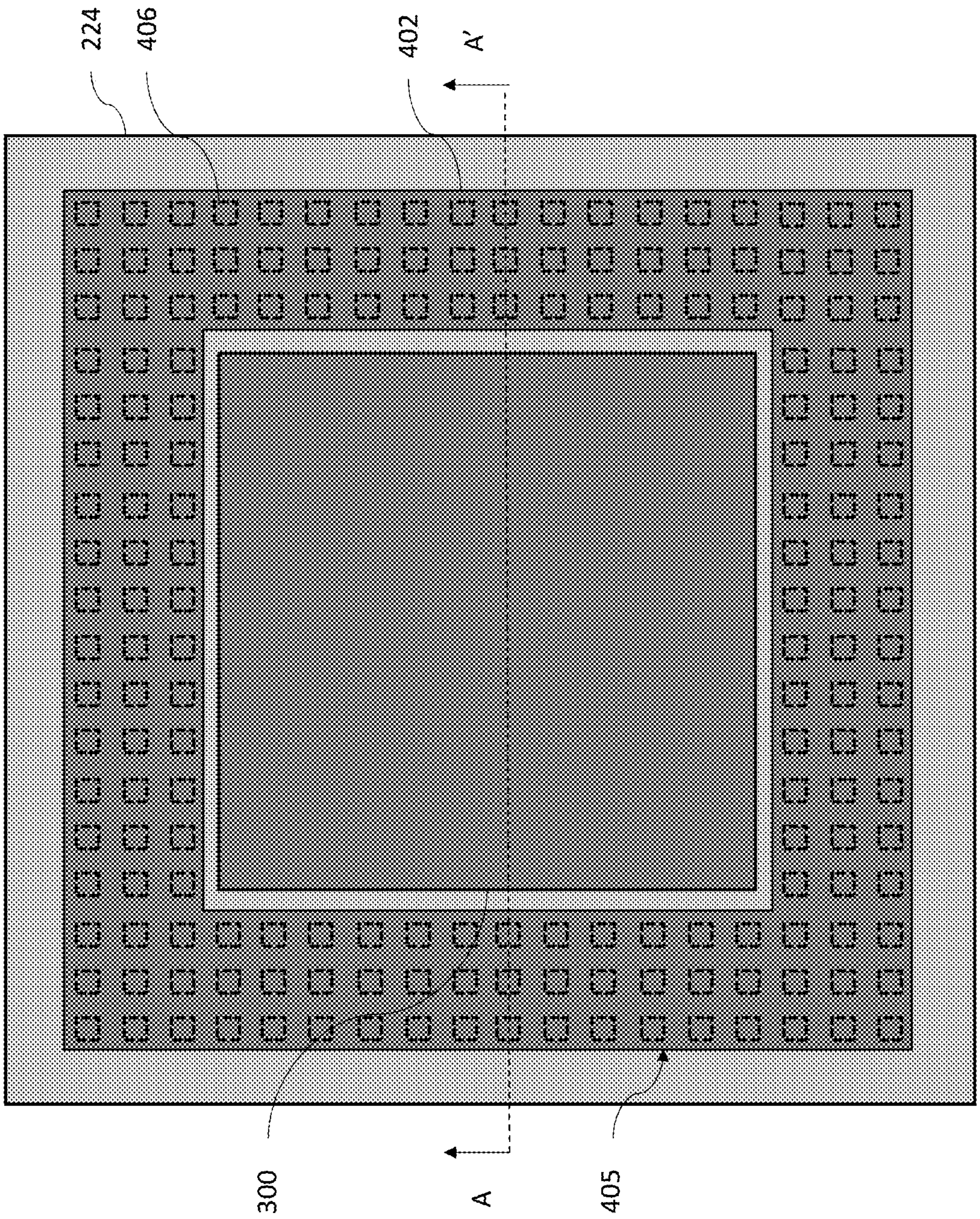
Figure 7C:
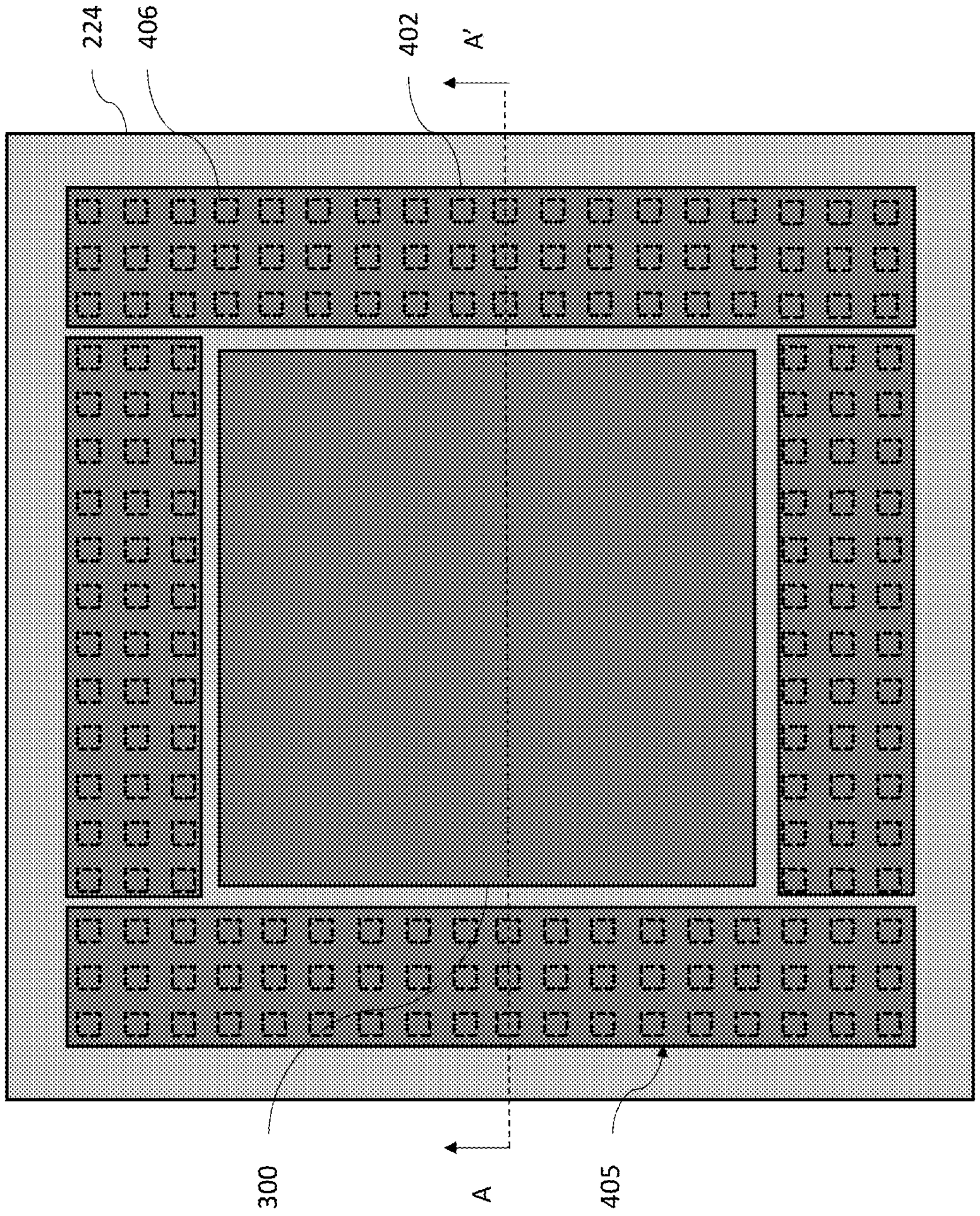

FIGS. 7A, 7B, and 7C illustrate the bonding of one or more heat transfer bridges 405 to the dielectric layer 224 and the heat transfer features 223 on the semiconductor device 200' using a bonding process, such as a hybrid bonding process. As discussed in greater detail below, the one or more heat transfer bridges 405 are a part of the heat dissipation system used to transfer heat away from the semiconductor device 200'. Each heat transfer bridge 405 comprises a substrate 402, a dielectric layer 404 formed on the substrate 402, and heat transfer features 406 formed in the substrate 402 and the dielectric layer 404. During the bonding process, the dielectric layer 404 is bonded to the dielectric layer 224 and each heat transfer feature 406 is bonded to a corresponding heat transfer feature 223. The connections between heat transfer features 406 and heat transfer features 223 may provide pathways for the heat generated by devices 204 during operation to be transferred to the one or more heat transfer bridges 405, thereby leading to higher efficiency and better long-term reliability of semiconductor package 600 as shown in FIG. 15.

Referring to FIG. 7A, the substrate 402 may comprise a thermally conductive semiconductor material, such silicon or the like. The dielectric layer 404 may be formed on the substrate 402 by the same or similar materials and methods as discussed above with reference to the dielectric layer 224, and the heat transfer features 406 may be formed in the dielectric layer 404 and the substrate 402 by the same or similar materials and methods as discussed above with reference to the heat transfer features 223. The heat transfer features 406 may have substantially the same shape and size as the heat transfer features 223 within process variations, and each heat transfer feature 406 may bond to a corresponding heat transfer feature 223 during bonding. FIG. 7A illustrates a hybrid bonding process as an example, and other bonding process may be used, such as a solder bonding process or the like. FIGS. 6A through 7A illustrate bonding the semiconductor device 300 over the semiconductor device 200' before bonding the one or more heat transfer bridges 405 over the semiconductor device 200' as an example, the semiconductor device 300 may be bonded over the semiconductor device 200' after the one or more heat transfer bridges 405 or the semiconductor device 300 and the one or more heat transfer bridges 405 may be bonded over the semiconductor device 200' at the same time.

FIGS. 7B and 7C show top views of the structure shown in FIG. 7A, in accordance with some embodiments. The cross-sectional view shown in FIG. 7A may be obtained from the reference cross-section A-A' in the top view shown in FIGS. 7B and 7C, wherein like reference numerals refer to like features. The heat transfer features 406 that are covered by the substrate 402 of the heat transfer bridge 405 is shown in dashed lines for illustrative purposes. FIG. 7B illustrates an example in which one heat transfer bridge 405 with a shape of a frame is disposed over the semiconductor device 200'. The heat transfer bridge 405 may encircle the semiconductor device 300 in the top view. FIG. 7C illustrates an example in which four heat transfer bridges 405 are disposed on the semiconductor device 200'. Each heat transfer bridge 405 has a rectangular shape and extends along a side of the semiconductor device 300 in the top view. Other shapes, sizes, numbers, and configurations may be used.

Figure 8:
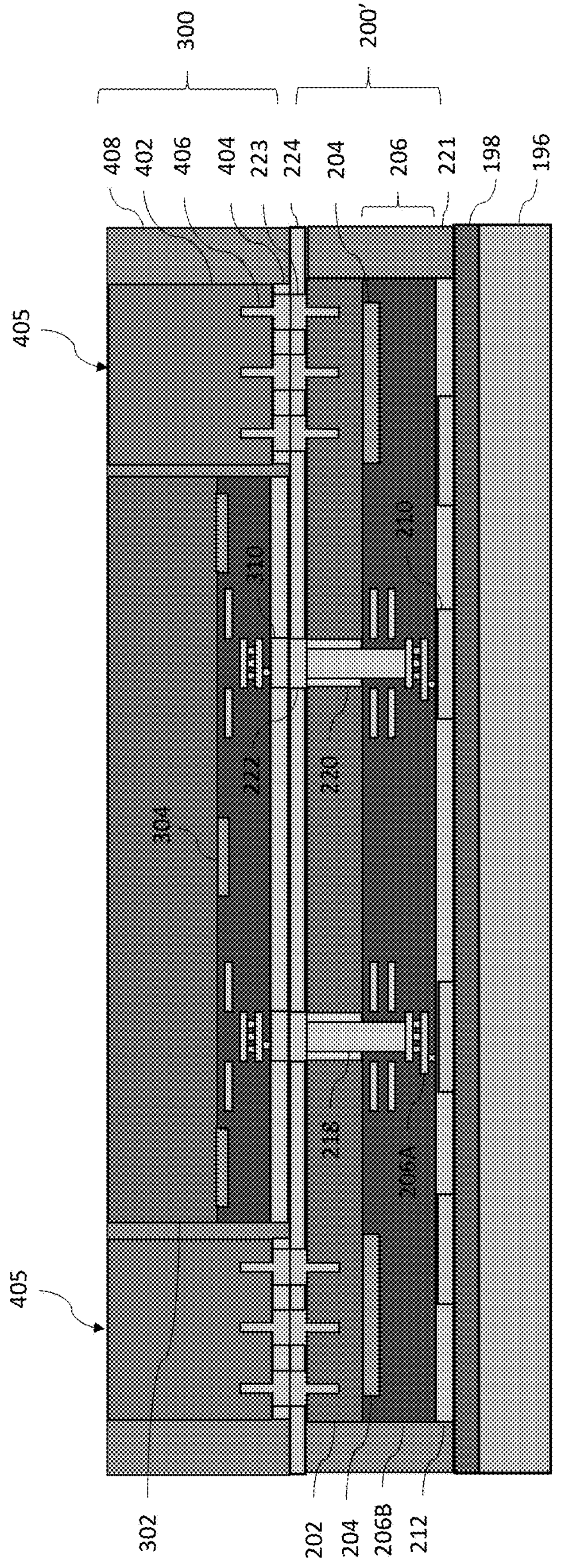

In FIG. 8, an encapsulant 408 is deposited over the remaining portions of the dielectric layer 224. The encapsulant 408 may extend along sidewalls of the semiconductor device 300 and the one or more heat transfer bridges 405. The encapsulant 408 may encircle the semiconductor device 300 and the one or more heat transfer bridges 405 in a top view. The encapsulant 408 may be formed using the same or similar materials and methods as discussed above with reference to the encapsulant 221. A thinning process may be applied to expose the substrate 302 and the substrate 402. The thinning process may comprise performing a CMP, grinding, an etch back (e.g., a wet etch), combinations thereof, or the like. In some embodiments, the thinning process may result in a back side of the substrate 302 being level with back sides of the one or more heat transfer bridges 405, and top surfaces of the encapsulant 408.

Figure 9:
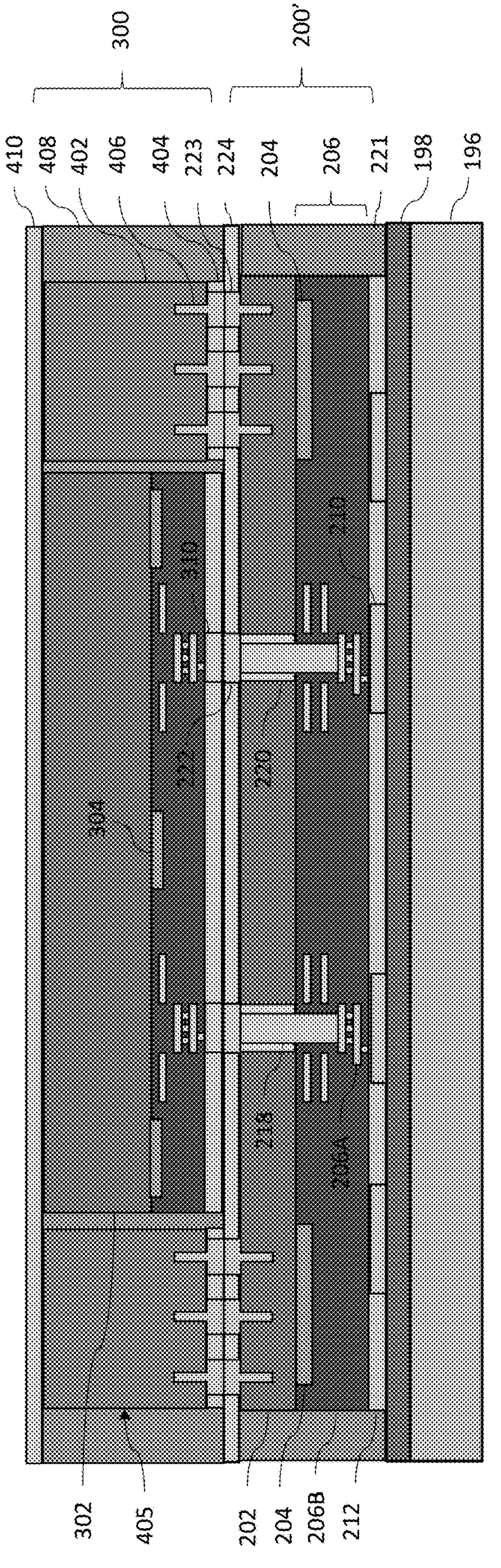

In FIG. 9, a dielectric layer 410 is deposited over the substrate 302, the one or more heat transfer bridges 405, and the encapsulant 408. The dielectric layer 410 may be formed using the same or similar materials and methods as discussed above with reference to the dielectric layer 224. The dielectric layer 410 may act as a bonding layer in subsequent processes.

Figure 10A:
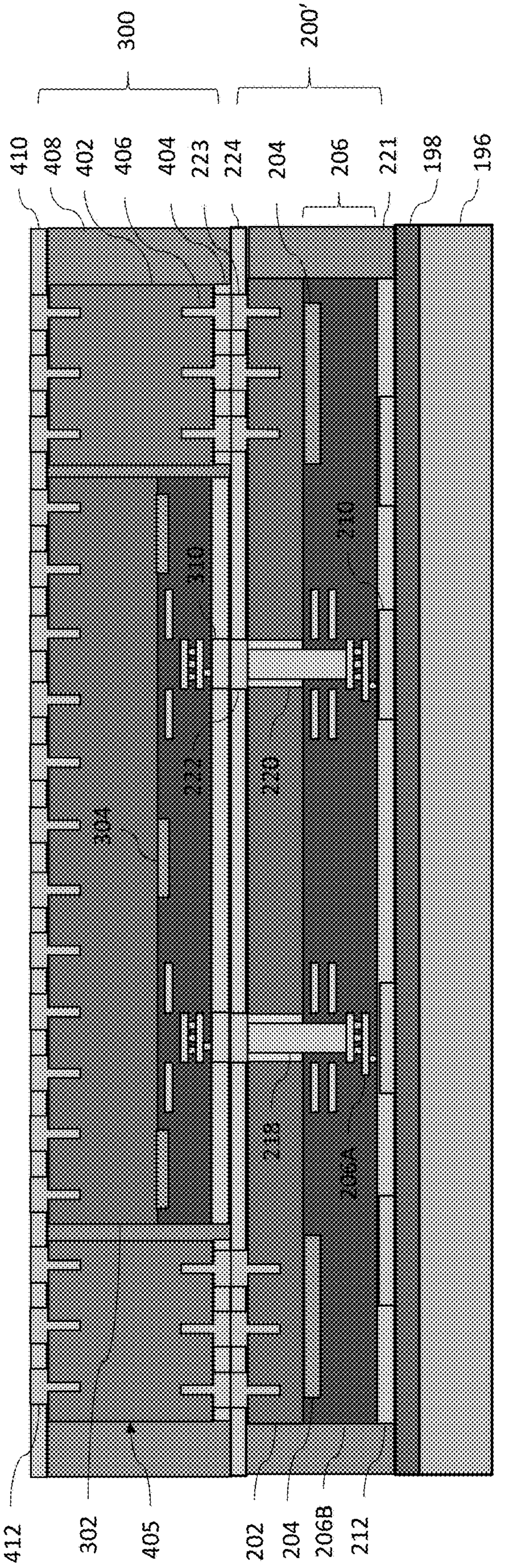

In FIG. 10A, heat transfer features 412 may be formed in the dielectric layer 410, the substrate 302, and the substrate 402 by the same or similar materials and methods as discussed above with reference to the heat transfer features 223. The heat transfer features 412 may have substantially the same shape and size as the heat transfer features 223 within process variations, or different shapes and sizes. The heat transfer features 412 may be electrically isolated from the integrated circuits of the semiconductor device 300 and/or the semiconductor device 200. As discussed in greater detail below, heat transfer features 412 are a part of the heat dissipation system. The heat transfer features 412 may provide pathways for heat generated by devices 304 during operation to be transferred out of the semiconductor device 300, and pathways for heat to be transferred out of the one or more heat transfer bridges 405, thereby leading to higher efficiency and better long-term reliability of semiconductor package 600 as shown in FIG. 15.

Figure 10B:
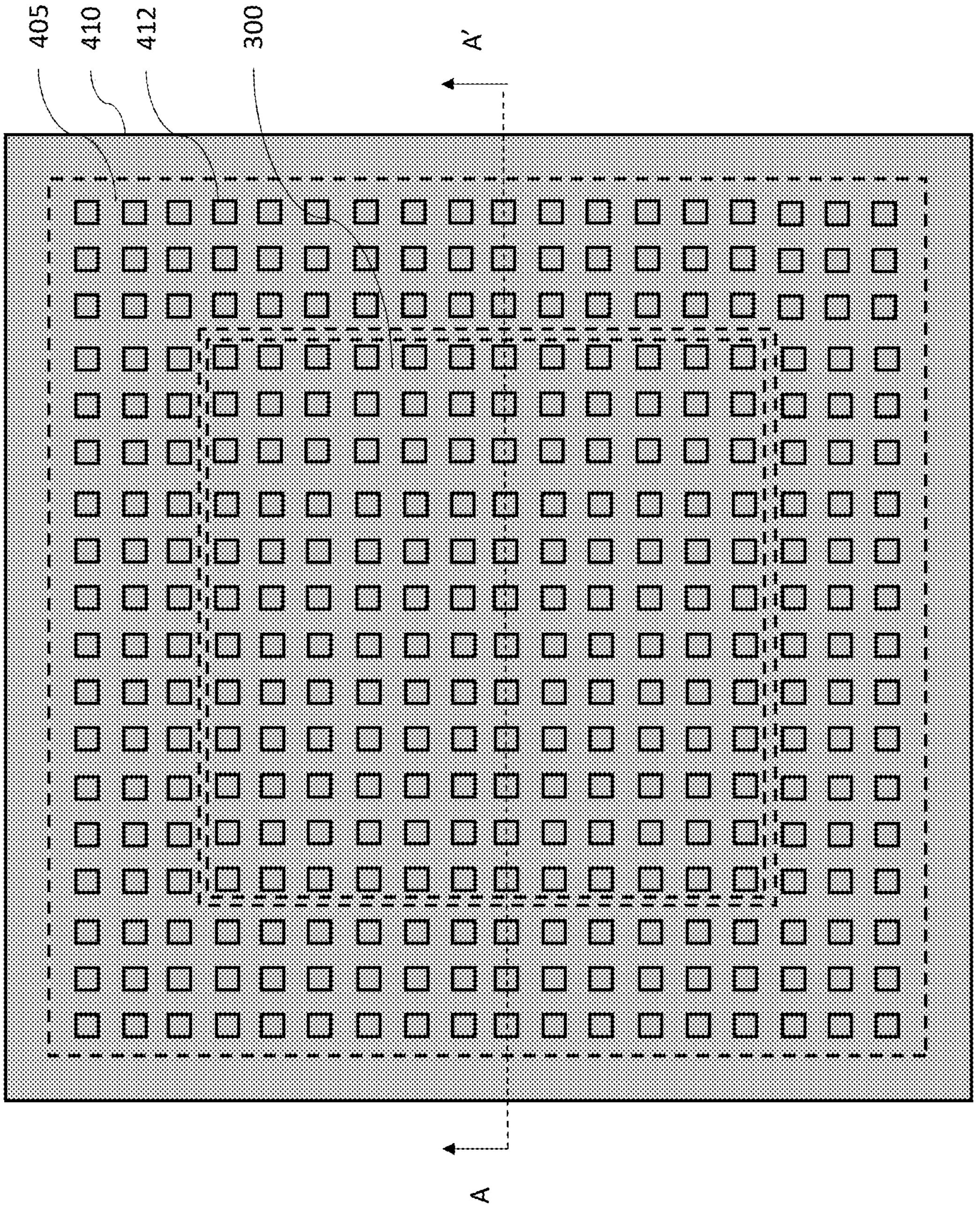

In FIG. 10B shows a top view of the structure shown in FIG. 10A. The cross-sectional view shown in FIG. 10A may be obtained from the reference cross-section A-A' in the top view shown in FIG. 10B, wherein like reference numerals refer to like features. The semiconductor device 300 and the heat transfer bridge 405 that are covered by the dielectric layer 410 are shown in dashed lines for illustrative purposes, wherein the heat transfer bridge 405 is illustrated to have a shape of a frame as an example. As shown in FIG. 10B, the heat transfer features 412 are disposed directly above the semiconductor device 300 and the heat transfer bridge 405 in an array comprising columns and rows. Eighteen columns and eighteen rows of the heat transfer features 412 are shown in FIG. 10B as an example, the array of the heat transfer features 412 may have any number of columns and rows of the heat transfer features 412, and the heat transfer features 412 may be arranged in other patterns, such as staggered rows or the like. The area within the boundaries of the semiconductor device 300 in the top view may have an area A2 and the area within the boundaries of the heat transfer bridge 405 in the top view may have an area A5. The sum of A2 and A5 is A6. The sum of areas of top surfaces of the heat transfer features 412 is A7, and a ratio of A7 to A6 may be in a range from about 30% to about 80%.

Figure 11:
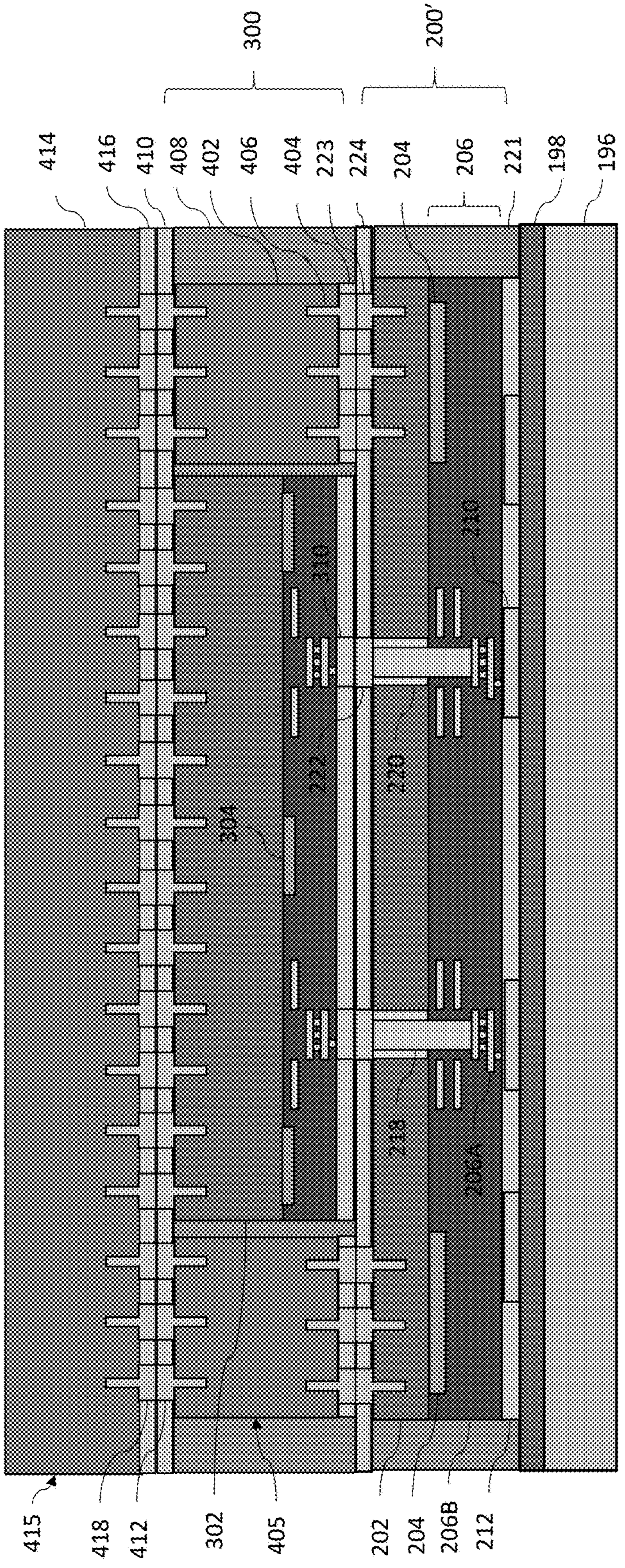

In FIG. 11, a heat transfer bridge 415 is bonded to the one or more heat transfer bridges 405 and the semiconductor device 300 using a bonding process, such as a hybrid bonding process. The heat transfer bridge 415 comprises a substrate 414, a dielectric layer 416 formed on the substrate 414, and heat transfer features 418 formed in the substrate 414 and the dielectric layer 416. During the bonding process, the dielectric layer 416 is bonded to the dielectric layer 410, and each heat transfer feature 418 is bonded to a corresponding heat transfer feature 412. The connections between heat transfer features 418 and heat transfer features 412 may provide pathways for the heat generated by devices 304 during operation to be transferred to the heat transfer bridge 415, and provide pathways for the heat transferred to the one or more heat transfer bridges 405 to be further transferred to the heat transfer bridge 415, thereby leading to higher efficiency and better long-term reliability of semiconductor package 600 as shown in FIG. 15.

Figure 12:
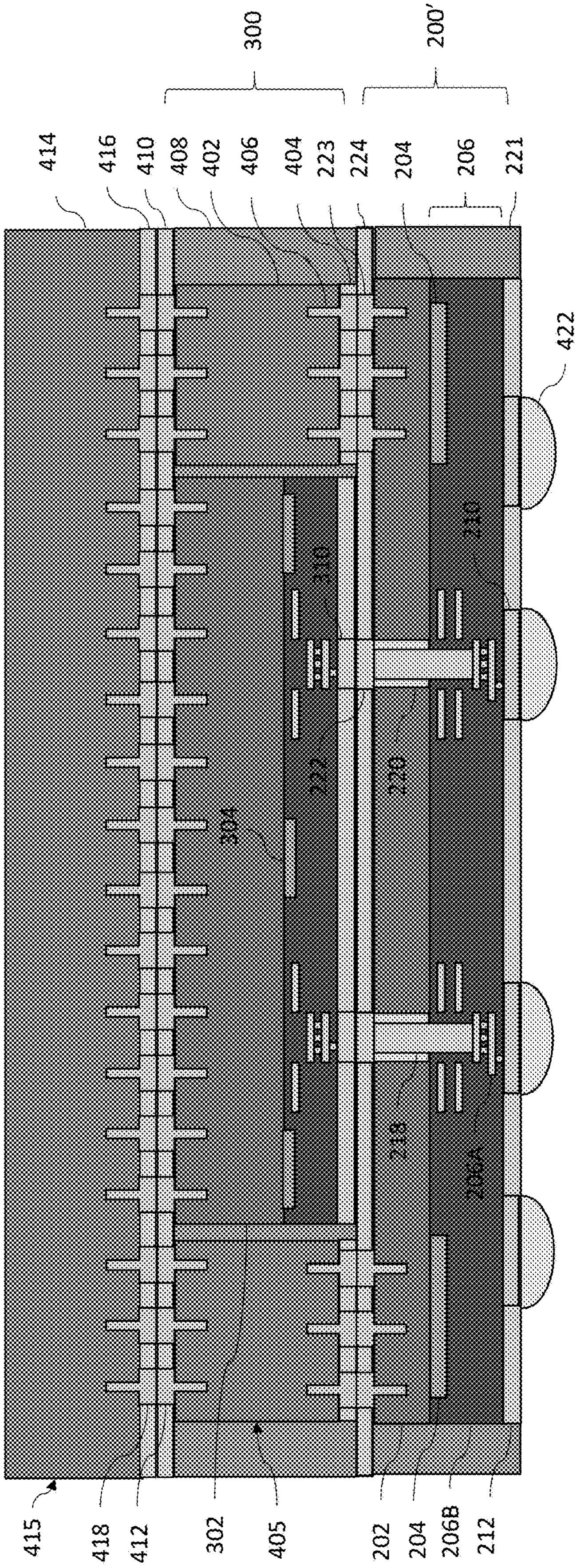

Still referring to FIG. 11, the substrate 414 of the heat transfer bridge 415 may comprise the same or similar material as discussed above with reference to the substrate 202. The dielectric layer 416 may be formed on the substrate 414 by the same or similar materials and methods as discussed above with reference to the dielectric layer 224, and the heat transfer features 418 may be formed in the dielectric layer 416 and the substrate 414 by the same or similar materials and methods as discussed above with reference to the heat transfer features 223. The heat transfer features 418 may have substantially the same shape and size as the heat transfer features 412 within process variations, and each heat transfer feature 418 may correspond to a heat transfer feature 412 during bonding. FIG. 12 illustrates a hybrid bonding process as an example, other bonding process may be used, such as a solder bonding process or the like.

In FIG. 12, the release film 198 and the carrier 196 (shown in FIG. 11) are removed, thereby exposing the dielectric layer 21. Then electrical connectors 422 are formed on the contact pads 210, which may provide bonding sites that connect the semiconductor device 200' and the semiconductor device 300 to the external components. The detaching of the carrier 196 may include projecting a light beam, such as a laser beam, on the release film 198 through the carrier 196, which may be transparent. As a result of the light exposure the release film 198 may be decomposed, and the carrier 196 may be lifted off. The formation of the electrical connectors 422 may include placing solder balls on contact pads 210, and reflowing the solder balls. In some embodiments, the electrical connectors 422 may be non-solder metal pillars, or metal pillars and solder caps over the non-solder metal pillars.

Figure 13:
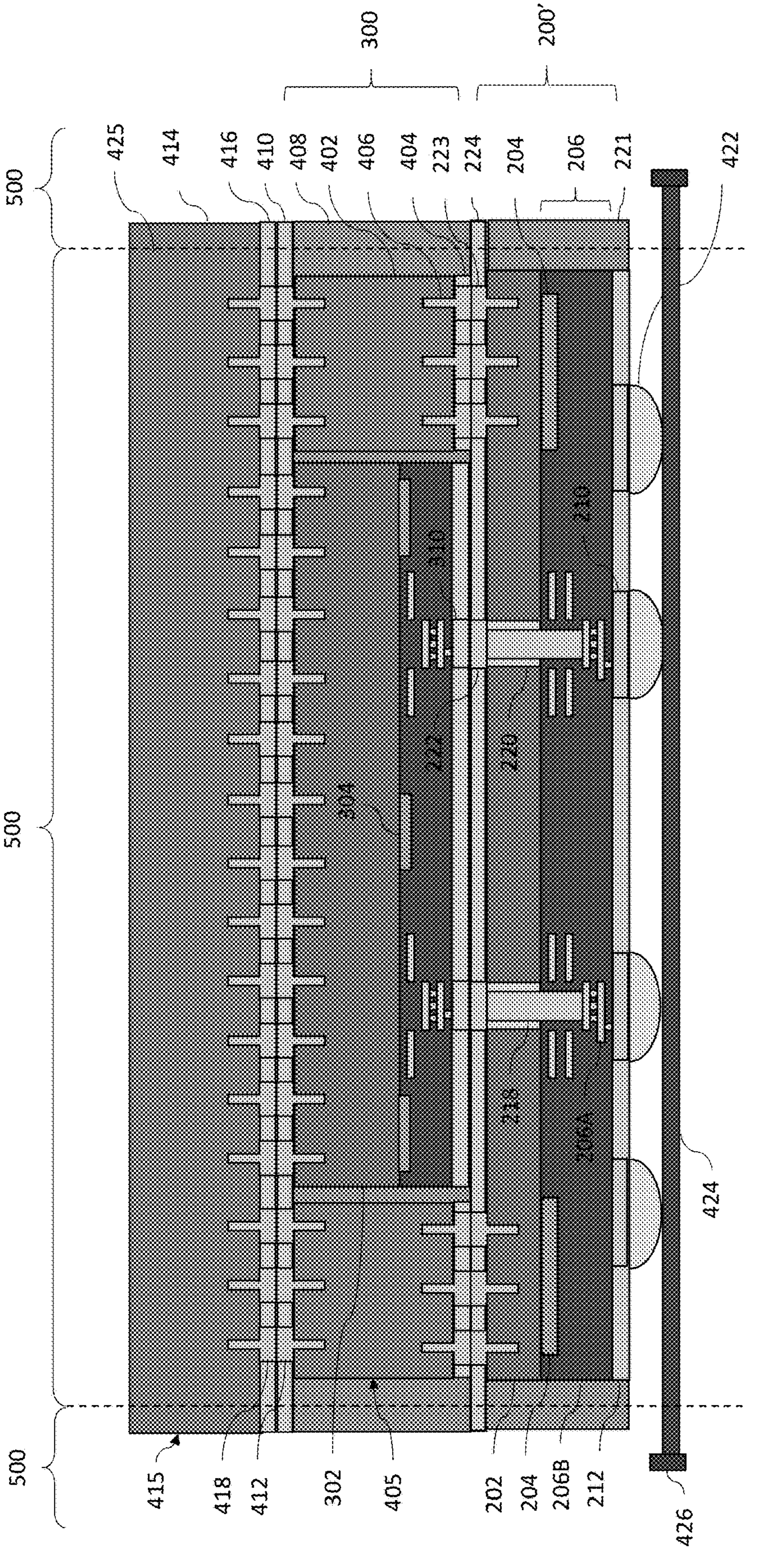
Figure 14:
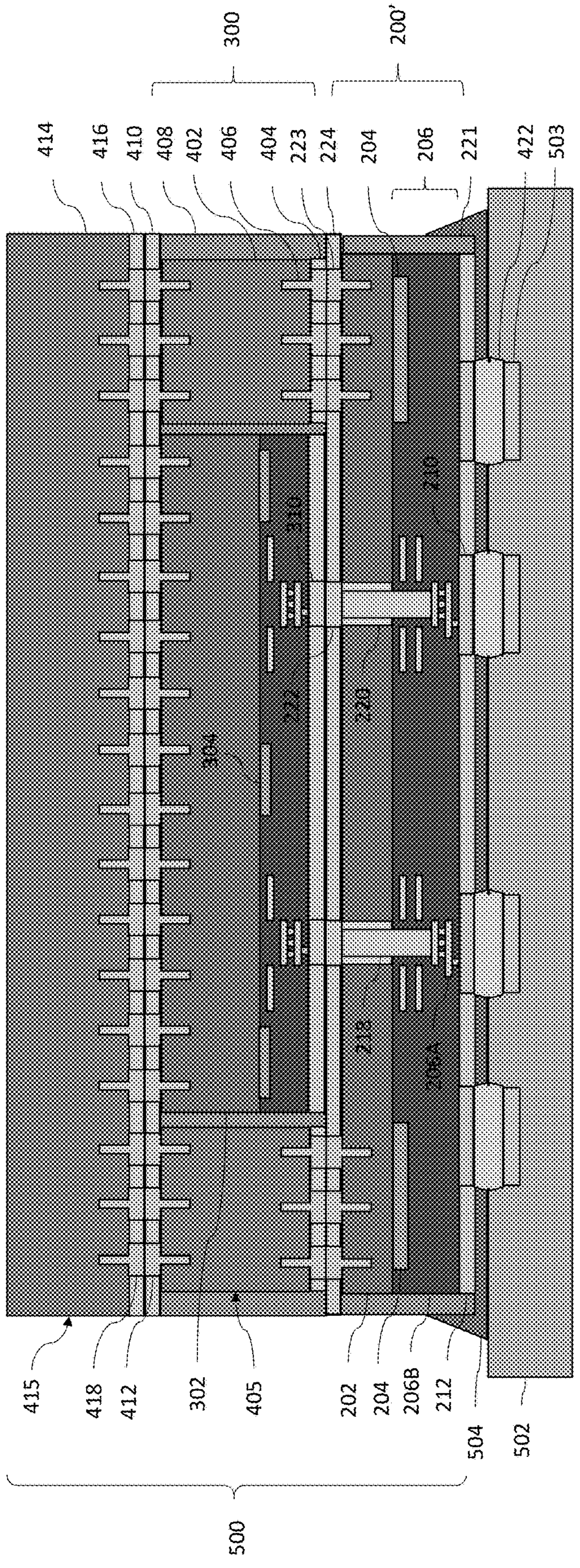

In FIG. 13, on the structure of FIG. 12 is attached to a tape 424 supported by a frame 426 and singulated along scribe lines 425. The processes discussed above may be performed at a wafer level and singulated along scribe lines 425 to form package component 500. In FIG. 14, the package component 500 is bonded to a substrate 502 via the electrical connectors 422 and underfill 504 is formed to reduce stress and protect the joints (e.g., electrical connectors 422) between the package component 500 and the substrate 502. The substrate 502 may be an interposer, a core substrate, a coreless substrate, a PCB, a package, or the like. FIG. 14, shows an embodiment in which the substrate 502 is a PCB, comprising contact pads 503 that are electrically connected to the package component 500. The underfill 504 may be dispensed into the gap between the package component 500 and the substrate 502 by a capillary flow process after the package component 500 is bonded to the substrate 502 or may be formed by a suitable deposition method before the package component 500 is bonded to the substrate 502. The underfill 504 may be subsequently cured.

In FIG. 15, a heat sink 506 is attached on a top surface of the heat transfer bridge 415 by an adhesive 508, such as a thermal interface material (TIM). The heat sink 506 may help to dissipate the heat generated by the structure underneath into the surrounding environment. The heat sink 506 may be formed of a suitable material with high thermal conductivity, such as copper or the like. The adhesive 508 may be formed of a suitable material with high thermal conductivity, such as a thermal paste, a gel-based thermal adhesive, a graphite or graphene film, the like, or the combinations thereof. The structure illustrated in FIG. 15 may be collectively referred to as the semiconductor package 600. During the operation of the semiconductor package 600, the devices 204 and the devices 304 may generate relatively high levels of heat. The heat generated by the devices 204 may be transferred to the heat sink 506 through the heat transfer features 223, heat transfer bridges 405, heat transfer features 412, and the heat transfer bridge 415. The heat generated by the devices 304 may be transferred to the heat sink 506 through heat transfer features 412 and the heat transfer bridge 415. Utilizing the heat dissipation system 510 to dissipate the heat generated by the devices 204 and the devices 304 may lead to higher efficiency and better long-term reliability of the semiconductor package 600.

The processes discussed above illustrate embodiments in which the heat transfer features (e.g., the heat transfer features 223) include vias (e.g., the bottom portions 223B) extending into the corresponding substrates (e.g., the substrate 202) and the heat transfer bridges (e.g. one or more heat transfer bridges 405) include a dielectric layer (e.g., the dielectric layer 224) used as a bonding layer. In some embodiments, the vias may be omitted in one or more of the substrates, and in some embodiments the dielectric layers may be omitted in one or more heat transfer bridges.

Figure 16:
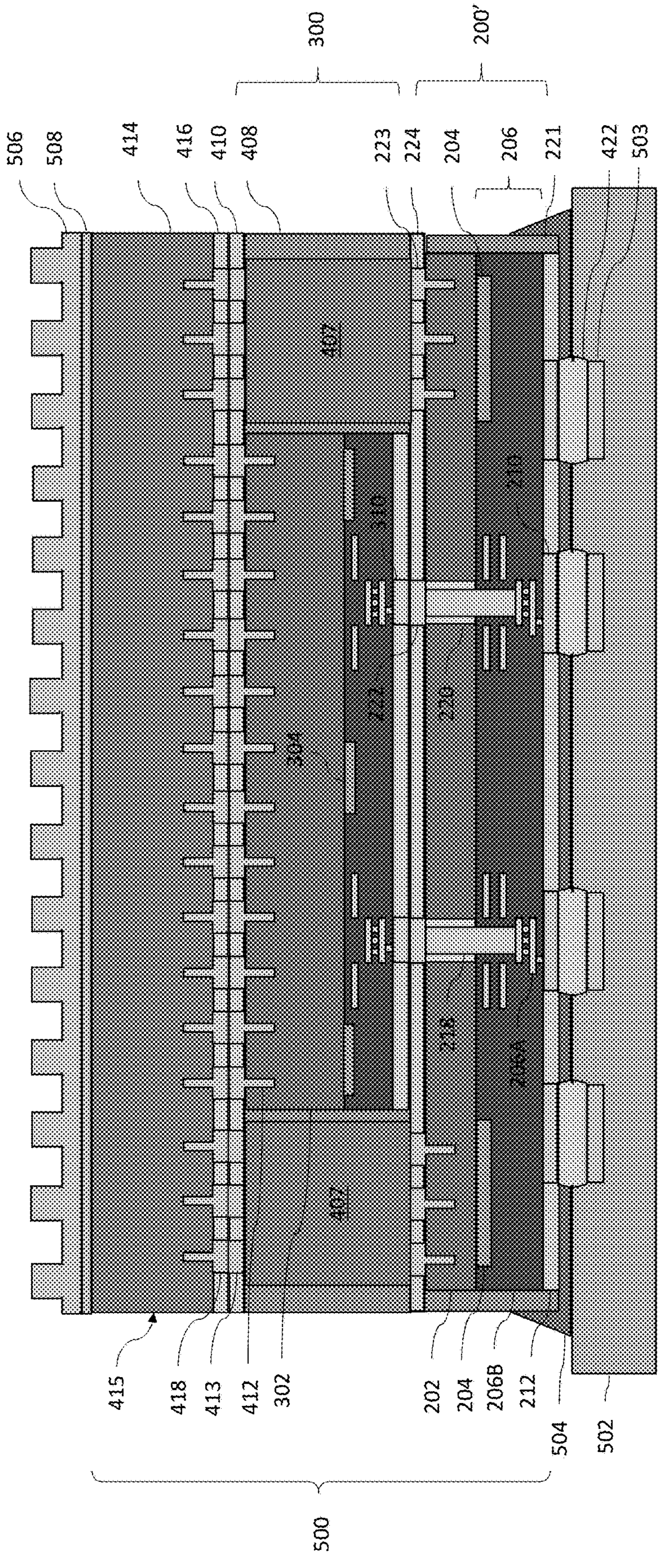

For example, FIG. 16 illustrates an embodiment similar to the semiconductor package 600 shown in FIG. 15, wherein like reference numerals refer to like features. The dielectric layer 410 may be formed on the one or more heat transfer bridges 407. Heat transfer features 413 may be formed in dielectric layer 410 and directly contact the one or more heat transfer bridges 407 without having vias extending into the one or more heat transfer bridges 407. In some embodiments, the one or more heat transfer bridges 407 may comprise a thermally conductive metallic material, such as copper or the like. The one or more heat transfer bridges 407 may be directly bonded to the heat transfer features 223 formed in the dielectric layer 224 by metal-to-metal bonding. The heat transfer features 413 may be directly bonded to the heat transfer features 418 formed in the dielectric layer 416 by metal-to-metal bonding. The shapes, sizes, numbers, and configurations of the one or more heat transfer bridges 407 may be substantially the same to the shapes, sizes, numbers, and configurations of the one or more heat transfer bridges 405 discussed with respect to FIGS. 7B and 7C.

Figure 17:
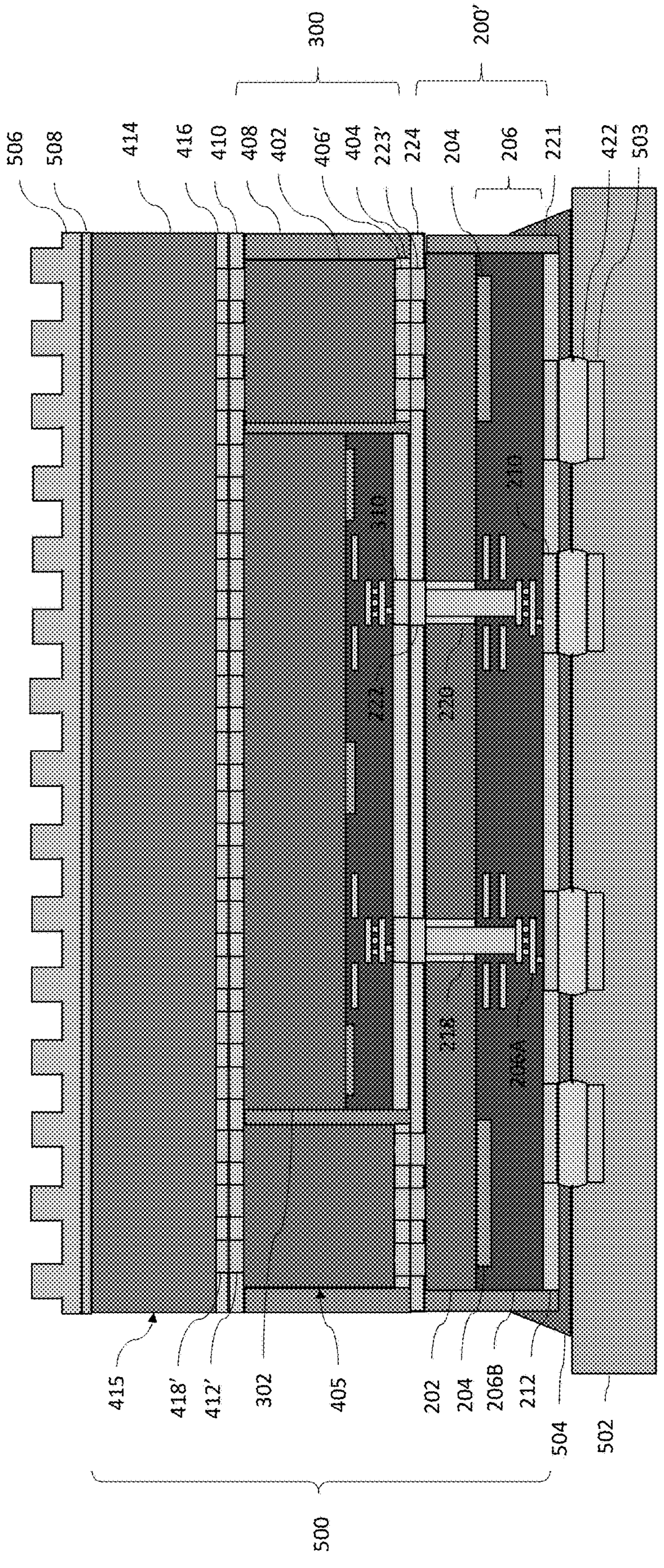
Figure 18:
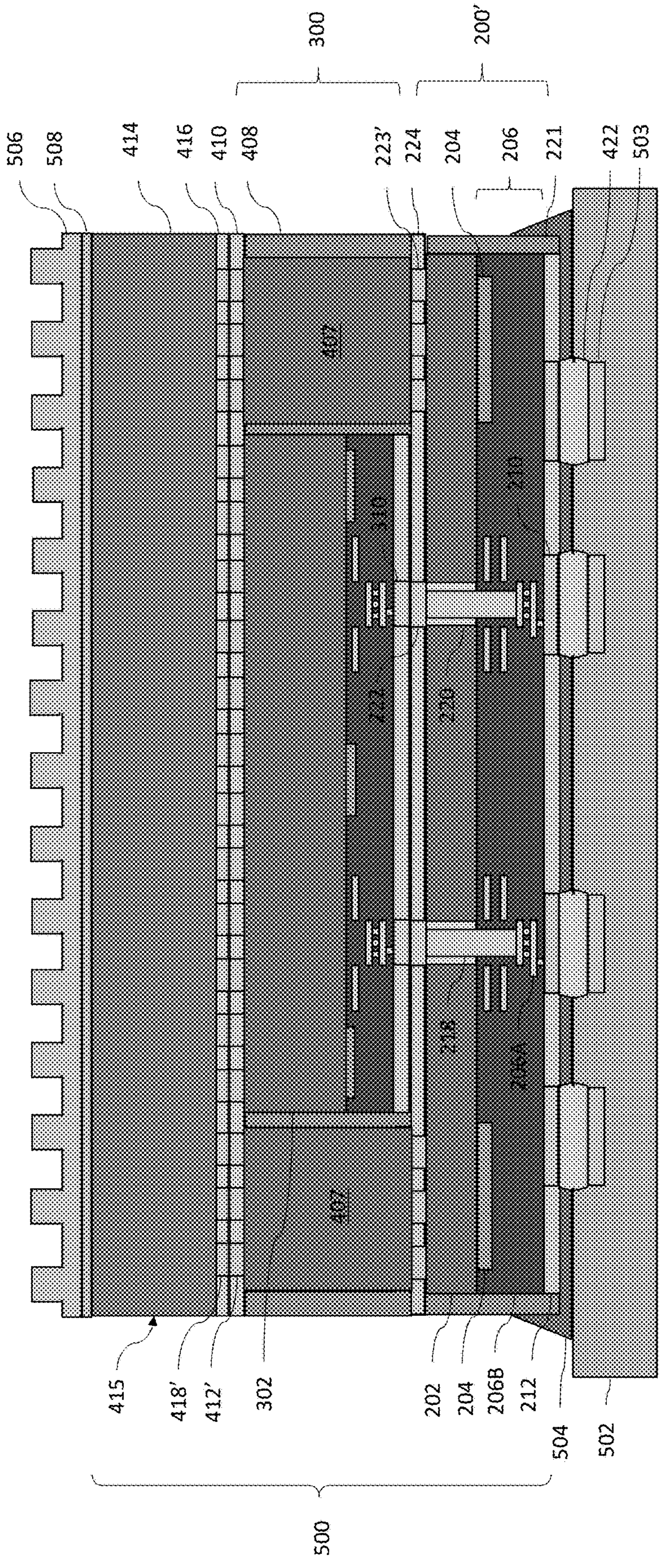

As another example, FIG. 17 illustrates an embodiment similar to the semiconductor package 600 shown in FIG. 15, wherein like reference numerals refer to like features, in which the vias are omitted in the substrates 202, 302, 402, and 414. In FIG. 17, heat transfer features 223' may be formed in the dielectric layer 224 and on the substrate 202, without vias extending into the substrate 202. Similarly, the heat transfer features 406' may be formed in the dielectric layer 404 and on the substrate 402, without vias extending into the substrate 402. The heat transfer features 412' may be formed in the dielectric layer 410 and heat transfer features 418' may be formed in the dielectric layer 416 in a similar manner without vias extending into the corresponding substrates. The heat transfer features 223', 406', 412', and 418' may be formed by the same or similar materials and methods as discussed above with reference to the top portions 223A of the heat transfer features 223. The shapes, sizes, numbers, and configurations of the heat transfer features 223', 406', 412', and 418' may be substantially the same to the shapes, sizes, numbers, and configurations of the top portions 223A of the heat transfer features 223 discussed with respect to FIGS. 5E and As yet another example, FIG. 18 illustrates an embodiment similar to the semiconductor package shown in FIG. 16, wherein like reference numerals refer to like features, in which the vias are additionally omitted in the substrates 202, 302, and 414. The heat transfer features 223', 412', and 418' may be formed by the same or similar materials and methods as discussed above with reference to the top portions 223A of the heat transfer features 223. The shapes, sizes, numbers, and configurations of the heat transfer features 223', 412', and 418' may be substantially the same to the shapes, sizes, numbers, and configurations of the top portions 223A of the heat transfer features 223 discussed with respect to FIGS. 5E and 5F. The one or more heat transfer bridges 407 may be bonded to the heat transfer features 223' and the heat transfer features 412' by metal-to-metal bonding.

The embodiments of the present disclosure have some advantageous features. By utilizing the heat dissipation system comprising the heat transfer features 223, the one or more heat transfer bridges 405, the heat transfer features 412, and the heat transfer bridge 415, the heat generated by devices 204 and the devices 304 may be transferred to the heat sink 506 and dissipated into the surrounding environment during the operation of the semiconductor package 600, which may lead to higher efficiency and better long-term reliability of the semiconductor package 600.

In an embodiment, a semiconductor package includes a first semiconductor device comprising a first substrate; first contact pads on the first substrate; a first thermally conductive feature on the first substrate, wherein the first thermally conductive feature extends into the first substrate, wherein the first thermally conductive feature is disposed over a first region of the first semiconductor device in a top view; a second semiconductor device over the first substrate, wherein the second semiconductor device includes second contact pads, wherein the second contact pads are electrically connected to corresponding ones of the first contact pads, and wherein the second semiconductor device is disposed over a second region of the first semiconductor device in the top view; a first thermally conductive bridge over the first region of the first semiconductor device and beside the second semiconductor device, the first thermally conductive bridge including a second substrate, a second thermally conductive feature on a first side of the second substrate, wherein the second thermally conductive feature extends into the second substrate, and wherein the second thermally conductive feature is bonded to the first thermally conductive feature; and a first encapsulant over the first semiconductor device and along sidewalls of the second semiconductor device and the first thermally conductive bridge. In an embodiment, the semiconductor package further includes a first dielectric layer on the first substrate and a second dielectric layer on the first side of the second substrate, wherein the first thermally conductive feature extends through the first dielectric layer, wherein the second thermally conductive feature extends through the second dielectric layer, and wherein the first dielectric layer is bonded to the second dielectric layer. In an embodiment, the semiconductor package further includes a second encapsulant along sidewalls of the first semiconductor device, wherein the first dielectric layer extends between the first encapsulant and the second encapsulant. In an embodiment, the first thermally conductive feature includes a first portion of a first height in the first dielectric layer, wherein the first height is equal to a thickness of the first dielectric layer, and a second portion of a second height in the first substrate, wherein the second height is equal to a distance from a bottom surface of the first dielectric layer to a bottom surface of the first thermally conductive feature, and wherein the second height is greater than the first height. In an embodiment, the first thermally conductive feature is electrically isolated from circuitry in the first semiconductor device. In an embodiment, the semiconductor package further includes a first dielectric layer on a second side of the second substrate and a third thermally conductive feature extending into the first dielectric layer and the second substrate. In an embodiment, the semiconductor package further includes a second thermally conductive bridge, wherein the second thermally conductive bridge includes a third substrate, a second dielectric layer, and a fourth thermally conductive feature extending into the second dielectric layer and the third substrate, wherein the fourth thermally conductive feature is bonded to the third thermally conductive feature.

In an embodiment, a semiconductor package includes a first semiconductor device comprising a first substrate; a first encapsulant along sidewalls of the first semiconductor device; a first dielectric layer on the first encapsulant and the first substrate; a first heat transfer feature extending into the first dielectric layer and the first substrate; a second semiconductor device comprising a second substrate, wherein the second semiconductor device is bonded to the first dielectric layer; a first heat transfer bridge disposed beside the second semiconductor device, the first heat transfer bridge including a third substrate, a second dielectric layer on a first side of the third substrate, wherein a second side of the third substrate is opposite to the first side of the third substrate, and a second heat transfer feature extending into the second dielectric layer and the third substrate, wherein the second heat transfer feature is bonded to the first heat transfer feature; and a second encapsulant on first dielectric layer and along sidewalls of the second semiconductor device. In an embodiment, a surface of the first dielectric layer is level with a surface of the first heat transfer feature. In an embodiment, the first heat transfer feature is electrically isolated from circuitry in the first semiconductor device. In an embodiment, the first heat transfer bridge encircles the second semiconductor device in a top view. In an embodiment, the first heat transfer feature has a first width in the first dielectric layer and a second width in the first substrate, and wherein the first width is greater than the second width. In an embodiment, the semiconductor package further includes a third dielectric layer on the second substrate, the second side of the third substrate, and the second encapsulant; a third heat transfer feature extending into the third dielectric layer and the second substrate; and a fourth heat transfer feature extending into the third dielectric layer and the third substrate. In an embodiment, the semiconductor package further includes a second heat transfer bridge over the second substrate and the second side of the third substrate.

In an embodiment, a method of manufacturing a semiconductor package includes forming a first encapsulant adjacent a first semiconductor device, the first semiconductor device comprising a first substrate and through vias in the first substrate; forming a first dielectric layer on the first semiconductor device and the first encapsulant; forming first bond pads in the first dielectric layer, wherein the first bond pads are connected to the through vias; forming first heat transfer features in the first dielectric layer and the first substrate; bonding a second semiconductor device to the first dielectric layer and the first bond pads; bonding a first heat transfer bridge to the first dielectric layer and the first heat transfer features, wherein the first heat transfer bridge is disposed along a first sidewall of the second semiconductor device, wherein the first heat transfer bridge includes second heat transfer features, and wherein the second heat transfer features are bonded to corresponding ones of the first heat transfer features; and forming a second encapsulant adjacent the second semiconductor device. In an embodiment, the second semiconductor device is bonded to the first dielectric layer and the first bond pads by fusion bonding. In an embodiment, forming first heat transfer features includes forming a first opening in the first dielectric layer; forming a second opening of in the first substrate; and depositing a metallic material in the first opening and the second opening by plating. In an embodiment, the method further includes forming a second dielectric layer on the second semiconductor device, the first heat transfer bridge, and the second encapsulant; and forming third heat transfer features in the second dielectric layer, the second semiconductor device, and the first heat transfer bridge. In an embodiment, the method further includes bonding a second heat transfer bridge to the second dielectric layer and the third heat transfer features by fusion bonding. In an embodiment, the method further includes bonding a second heat transfer bridge to the first dielectric layer and the first heat transfer features, wherein the second heat transfer bridge is disposed along a second sidewall of the second semiconductor device, wherein the second heat transfer bridge includes third heat transfer features, and wherein the third heat transfer features are bonded to corresponding ones of the first heat transfer features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:

a first semiconductor device comprising a first substrate and an interconnect structure on a first side of the first substrate;

a first dielectric layer on a second side of the first substrate opposing the first side of the first substrate;

first contact pads embedded in the first dielectric layer;

a first thermally conductive feature comprising a first portion embedded in the first dielectric layer and comprising a second portion embedded in the first substrate, wherein the first thermally conductive feature is electrically isolated, wherein the second portion of the first thermally conductive feature extends into, but not through, the first substrate, wherein the first thermally conductive feature is disposed over a first region of the first semiconductor device in a top view;

a second semiconductor device over the first substrate and the first dielectric layer, wherein the second semiconductor device comprises second contact pads, wherein the second contact pads are electrically connected to corresponding ones of the first contact pads, wherein the second semiconductor device is disposed over a second region of the first semiconductor device in the top view, wherein the first region surrounds the second region in the top view;

a first thermally conductive bridge over the first region of the first semiconductor device and beside the second semiconductor device, the first thermally conductive bridge comprising:

a second substrate, wherein the second substrate comprises a thermally conductive semiconductor material that extends continuously from a first side of the second substrate facing the first semiconductor device to a second side of the second substrate opposing the first side of the second substrate;

a second dielectric layer on the first side of the second substrate; and a second thermally conductive feature comprising a first portion embedded in the second dielectric layer and comprising a second portion embedded in the second substrate, wherein the second thermally conductive feature is electrically isolated, wherein the second portion of the second thermally conductive feature extends into, but not through, the second substrate, wherein the first portion of the second thermally conductive feature is bonded to the first portion of the first thermally conductive feature, wherein the second dielectric layer is bonded to the first dielectric layer; and a first encapsulant over the first dielectric layer and along sidewalls of the second semiconductor device and the first thermally conductive bridge, wherein the second semiconductor device and the first thermally conductive bridge are separated by the first encapsulant, wherein the second side of the second substrate is level with an upper surface of the first encapsulant distal from the first substrate and an upper surface of the second semiconductor device distal from the first substrate.

2. The semiconductor package of claim 1, further comprising a second encapsulant along sidewalls of the first semiconductor device, wherein the first dielectric layer is interposed between, and contacts, the first encapsulant and the second encapsulant, wherein the first dielectric layer, the first encapsulant, and the second encapsulant have a same width such that sidewalls of the first dielectric layer are aligned along same lines with respective sidewalls of the first encapsulant and respective sidewalls of the second encapsulant.

3. The semiconductor package of claim 2, further comprising:

a third dielectric layer on the second semiconductor device, on the first encapsulant, and on the second side of the second substrate, wherein sidewalls of the third dielectric layer are aligned along same lines with respective sidewalls of the first encapsulant; and a third thermally conductive feature comprising a first portion embedded in the third dielectric layer and comprising a second portion embedded in the second substrate, wherein the third thermally conductive feature is electrically isolated, wherein the second portion of the third thermally conductive feature extends into the second substrate from the second side of the second substrate, wherein a sum of a height of the second portion of the third thermally conductive feature and a height of the second portion of the second thermally conductive feature is smaller than a thickness of the second substrate.

4. The semiconductor package of claim 3, further comprising a second thermally conductive bridge on the third dielectric layer, wherein the second thermally conductive bridge comprises:

a third substrate;

a fourth dielectric layer at a first side of the third substrate facing the second substrate, wherein the fourth dielectric layer is in contact with the third dielectric layer, wherein the third substrate, the fourth dielectric layer, and the third dielectric layer have a same width such that sidewalls of the fourth dielectric layer are aligned along same lines with respective sidewalls of the third dielectric layer and respective sidewalls of the third substrate; and a fourth thermally conductive feature comprising a first portion embedded in the fourth dielectric layer and comprising a second portion embedded in the third substrate, wherein the fourth thermally conductive feature is electrically isolated, wherein the fourth thermally conductive feature is bonded to the third thermally conductive feature.

5. The semiconductor package of claim 4, further comprising:

a fifth thermally conductive feature comprising a first portion embedded in the third dielectric layer and comprising a second portion embedded in a substrate of the second semiconductor device, wherein the fifth thermally conductive feature is electrically isolated; and a sixth thermally conductive feature comprising a first portion embedded in the fourth dielectric layer and comprising a second portion embedded in the third substrate, wherein the sixth thermally conductive feature is electrically isolated, wherein the fifth thermally conductive feature is bonded to the sixth thermally conductive feature.

6. The semiconductor package of claim 4, further comprising a heat sink attached to a second side of the third substrate opposing the first side of the third substrate.

7. The semiconductor package of claim 1, wherein the first portion of the first thermally conductive feature has a first height, wherein the first height is equal to a thickness of the first dielectric layer, wherein the second portion of the first thermally conductive feature has a second height, wherein the second height is equal to a distance from a bottom surface of the first dielectric layer facing the first substrate to a bottom surface of the first thermally conductive feature distal from the first thermally conductive bridge, and wherein the second height is greater than the first height.

8. A semiconductor package comprising:

a first semiconductor device comprising a first substrate;

a first encapsulant along sidewalls of the first semiconductor device;

a first dielectric layer on the first encapsulant and the first substrate;

a first heat transfer feature extending into the first dielectric layer and the first substrate, wherein the first heat transfer feature is electrically isolated;

a second semiconductor device comprising a second substrate, wherein the second semiconductor device is bonded to the first dielectric layer;

a first heat transfer bridge disposed beside the second semiconductor device, the first heat transfer bridge comprising:

a third substrate having a single-layer structure;

a second dielectric layer on a first side of the third substrate facing the first substrate, wherein a second side of the third substrate is opposite to the first side of the third substrate, wherein the second dielectric layer is in contact with the first dielectric layer; and a second heat transfer feature extending into the second dielectric layer and the third substrate, wherein the second heat transfer feature is electrically isolated, wherein the second heat transfer feature is covered by extends into, but not through, the third substrate, and wherein the second heat transfer feature is bonded to the first heat transfer feature; and a second encapsulant on the first dielectric layer and along sidewalls of the second semiconductor device and along sidewalls of the first heat transfer bridge, wherein an upper surface of the second encapsulant distal from the first substrate is level with the second side of the third substrate and level with a surface of the second semiconductor device distal from the first substrate.

9. The semiconductor package of claim 8, wherein a surface of the first dielectric layer distal from the first substrate is level with a surface of the first heat transfer feature.

10. The semiconductor package of claim 8, wherein the first heat transfer bridge encircles the second semiconductor device in a top view.

11. The semiconductor package of claim 8, wherein the first heat transfer feature has a first width in the first dielectric layer and a second width in the first substrate, and wherein the first width is greater than the second width.

12. The semiconductor package of claim 8, further comprising:

a third dielectric layer on the second substrate, the second side of the third substrate, and the second encapsulant;

a third heat transfer feature extending into the third dielectric layer and the second substrate, wherein the third heat transfer feature is electrically isolated; and a fourth heat transfer feature extending into the third dielectric layer and the third substrate, wherein the fourth heat transfer feature is electrically isolated, wherein the fourth heat transfer feature and the second heat transfer feature are aligned along a same vertical line and are spaced apart from each other.

13. The semiconductor package of claim 12, further comprising a second heat transfer bridge over the second substrate and the second side of the third substrate, wherein the second heat transfer bridge comprises:

a fourth substrate having a single-layer structure;

a fourth dielectric layer on a first side of the fourth substrate facing the second substrate, wherein the fourth substrate, the fourth dielectric layer, the third dielectric layer, and the second encapsulant have a same width; and a fifth heat transfer feature and a sixth heat transfer feature that extend into the fourth dielectric layer and the fourth substrate, wherein the fifth heat transfer feature and the sixth heat transfer feature are electrically isolated, wherein the fourth dielectric layer is in contact with the third dielectric layer, wherein the fifth heat transfer feature and the sixth heat transfer feature are bonded to the third heat transfer feature and the fourth heat transfer feature, respectively.

14. The semiconductor package of claim 8, wherein the first dielectric layer is disposed between, and contacts, the first encapsulant and the second encapsulant.

15. The semiconductor package of claim 14, wherein the first encapsulant, the first dielectric layer, and the second encapsulant have a same width such that sidewalls of the first dielectric layer are aligned along same lines with respective sidewalls of the first encapsulant and respective sidewalls of the second encapsulant.

16. A semiconductor package comprising:

a first semiconductor die comprising a first substrate;

a first encapsulant on sidewalls of the first semiconductor die;

a first dielectric layer on the first encapsulant and the first substrate;

a first heat transfer feature extending into the first dielectric layer and the first substrate, wherein the first heat transfer feature is electrically isolated;

a first heat transfer bridge on the first dielectric layer, the first heat transfer bridge comprising:

a second substrate;

a second dielectric layer on a first side of the second substrate facing the first substrate, wherein the second dielectric layer is bonded to the first dielectric layer; and a second heat transfer feature extending into the second dielectric layer and the second substrate, wherein the second heat transfer feature is electrically isolated, wherein the second heat transfer feature is bonded to the first heat transfer feature;

a second encapsulant on sidewalls of the first heat transfer bridge, wherein an upper surface of the second encapsulant distal from the first substrate is level with a second side of the second substrate, wherein the second side of the second substrate is opposite to the first side of the second substrate;

a third dielectric layer on the second encapsulant and the second side of the second substrate; and a third heat transfer feature extending into the third dielectric layer and the second substrate, wherein the third heat transfer feature is electrically isolated, wherein the second heat transfer feature and the third heat transfer feature are separated by the second substrate.

17. The semiconductor package of claim 16, wherein the first heat transfer feature, the second heat transfer feature, and the third heat transfer feature are T-shaped.

18. The semiconductor package of claim 16, wherein the second heat transfer feature is bonded to the first heat transfer feature by metal-to-metal bonding, and the second dielectric layer is bonded to the first dielectric layer by dielectric-to-dielectric bonding.

19. The semiconductor package of claim 16, further comprising:

a second heat transfer bridge on the third dielectric layer, the second heat transfer bridge comprising:

a third substrate;

a fourth dielectric layer on a first side of the third substrate facing the second substrate, wherein the fourth dielectric layer is bonded to the third dielectric layer, wherein the third substrate, the fourth dielectric layer, and the third dielectric layer have a same width such that sidewalls of the fourth dielectric layer are aligned along same lines with respective sidewalls of the third substrate and respective sidewalls of the third dielectric layer; and a fourth heat transfer feature extending into the fourth dielectric layer and the third substrate, wherein the fourth heat transfer feature is electrically isolated, wherein the fourth heat transfer feature is bonded to the third heat transfer feature.

20. The semiconductor package of claim 16, wherein the first encapsulant, the second encapsulant, the first dielectric layer, and the third dielectric layer have a same width such that sidewalls of the first encapsulant are aligned along same lines with respective sidewalls of the second encapsulant, respective sidewalls of the first dielectric layer, and respective sidewalls of the third dielectric layer.

* * * * *